United States Patent
Maruyama et al.

(10) Patent No.: US 6,249,135 B1
(45) Date of Patent: Jun. 19, 2001

(54) METHOD AND APPARATUS FOR PASSIVE OPTICAL CHARACTERIZATION OF SEMICONDUCTOR SUBSTRATES SUBJECTED TO HIGH ENERGY (MEV) ION IMPLANTATION USING HIGH-INJECTION SURFACE PHOTOVOLTAGE

(75) Inventors: Shigeyuki Maruyama; Kazuhiro Tashiro; Makoto Haseyama; Futoshi Fukaya, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/268,338

(22) Filed: Mar. 16, 1999

Related U.S. Application Data

(63) Continuation-in-part of application No. 09/009,261, filed on Jan. 20, 1998, now abandoned.

(30) Foreign Application Priority Data

Sep. 19, 1997 (JP) .................................................. 9-255786
Sep. 17, 1998 (JP) .................................................. 10-263579

(51) Int. Cl.[7] ................................................. G01R 31/26
(52) U.S. Cl. ........................... 324/765; 324/755; 324/757
(58) Field of Search ................................... 324/754–758, 324/765; 439/70, 71

(56) References Cited

U.S. PATENT DOCUMENTS

| | | | |
|---|---|---|---|
| 5,880,590 | * 3/1999 | Desai et al. | 324/757 |
| 5,949,246 | * 9/1999 | Frankeny et al. | 324/765 |
| 6,086,386 | * 7/2000 | Fjelstad et al. | 439/70 |

OTHER PUBLICATIONS

Y. Nakata et al; "A Wafer–Level Burn–in Technology Using the Contactor Controlled Thermal Expansion", Kyoto Laboratory; Apr. 3, 1997.

* cited by examiner

*Primary Examiner*—Ernest Karlsen
*Assistant Examiner*—Russell M. Kobert
(74) *Attorney, Agent, or Firm*—Armstrong, Westerman, Hattori, McLeland & Naughton, LLP

(57) ABSTRACT

A semiconductor testing device is used for testing a semiconductor device which has at least one spherical connection terminal. The testing device includes an insulating substrate having an opening formed therein at a position corresponding to the position of the spherical connection terminal, and a contact member, formed on the insulating substrate, including a connection portion which is connected with the spherical connection terminal, at least the connection portion being deformable and extending into the opening.

3 Claims, 32 Drawing Sheets

FIG. 40A
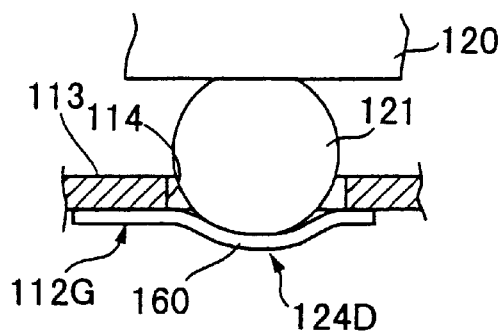
FIG. 40B
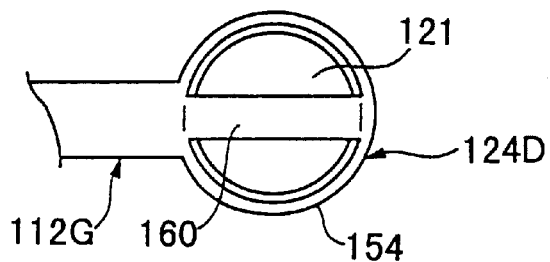
FIG. 41A
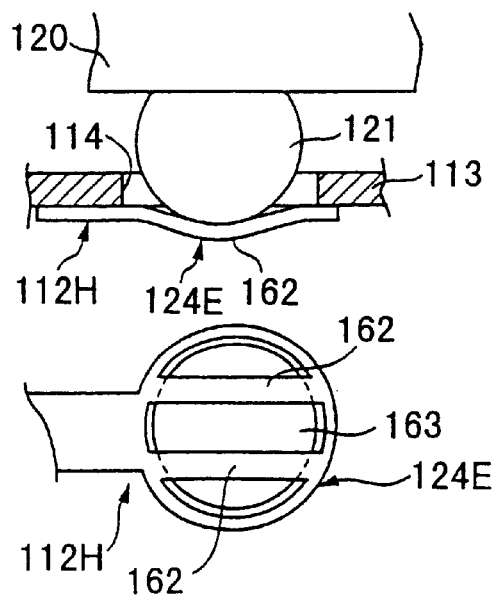
FIG. 41B

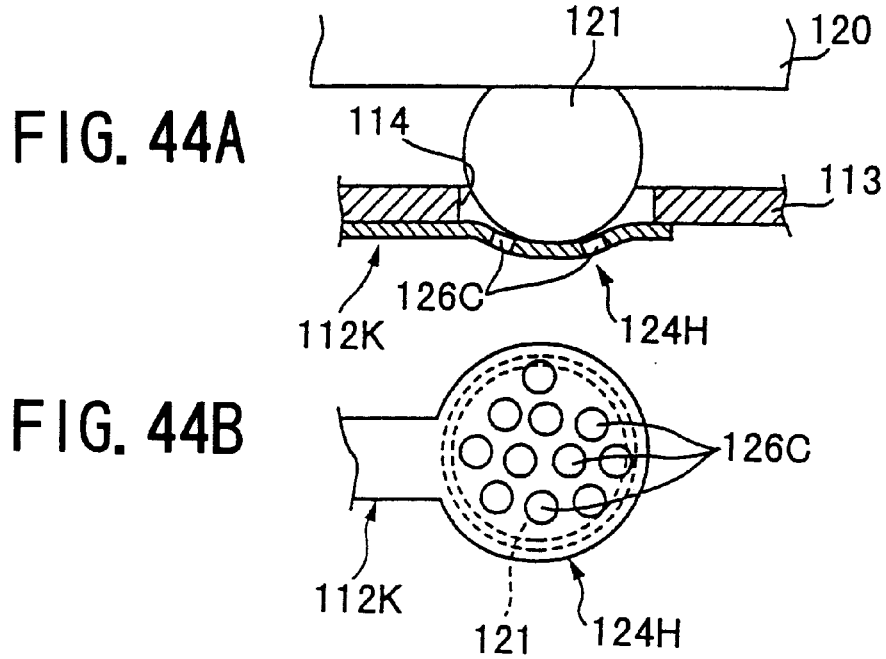
FIG. 44A
FIG. 44B
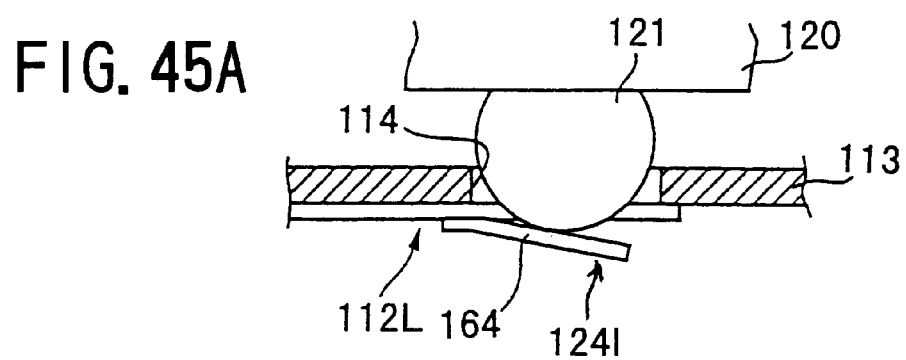
FIG. 45A
FIG. 45B

US 6,249,135 B1

METHOD AND APPARATUS FOR PASSIVE OPTICAL CHARACTERIZATION OF SEMICONDUCTOR SUBSTRATES SUBJECTED TO HIGH ENERGY (MEV) ION IMPLANTATION USING HIGH-INJECTION SURFACE PHOTOVOLTAGE

This is a continuation-in-part application of U.S. patent application Ser. No. 09/009,261, filed on Jan. 20, 1998, now abandoned.

BACKGROUND OF THE INVENTION

1. Field of the Invention

The present invention relates to a semiconductor testing device, and, in-particular, to a semiconductor testing device which is suitable for use in testing of a semiconductor chip and semiconductor device (which will be generically referred to as a to-be-tested device or a semiconductor device, hereinafter) each having spherical connection terminals.

Recently, a high-density, high-speed and miniaturized semiconductor device is required for many applications. In order to respond to this requirement, a mounting method in which a plurality of semiconductor chips, not sealed in a package (so-called bare chips), or a plurality of semiconductor devices, each having a BGA (Ball Grid Array) structure, are directly mounted on a circuit substrate come into use.

In such a mounting method, for example, if one of a plurality of bare chips or a plurality of semiconductor devices arranged to form an apparatus has a defect, the entire apparatus is defective. Accordingly high reliability is required for each bare chip or each semiconductor device.

Therefore, testing of particular bare chips or semiconductor devices so as to ensure that the bare chips or semiconductor devices function normally is important.

2. Description of the Related Art

In the related art, various testing methods for testing a non-resin-sealed bare chip or a resin sealed semiconductor device having spherically projecting spherical connection terminals at the bottom surface thereof have been proposed and used. Hereinafter, each of a non-resin-sealed bare chip and a resin-sealed semiconductor device will be generically referred to as a 'semiconductor device'.

When an electrical operational test of such a semiconductor device is performed, a probe of a testing device is placed in contact with the spherical connection terminals. Therefore, it is necessary that a test of electrical connection is performed in a condition in which deterioration of the spherical connection terminals is negligible. Further, the test should have high reliability at low cost.

One semiconductor testing method in the related art, for example, uses a semiconductor testing socket. When the semiconductor testing socket is used, an electrical operational test of a semiconductor device is performed using a probe. In this testing method, a testing substrate, on which a plurality of probes are arranged at positions corresponding to the positions of the plurality of spherical connection terminals formed on the bottom surface of the semiconductor device, is used. The projecting ends of these probes are caused to directly contact the spherical connection terminals, respectively, so as to perform the test.

This semiconductor testing socket has the plurality of probes arranged corresponding to the arrangement of the plurality of spherical connection terminals of the semiconductor device. Each probe has bent portion which is bent to a U-shape. When the probe is pressed onto a respective one of the spherical connection terminals of the semiconductor device, the bent portion of the probe is deformed, and thus, possible damage to the spherical connection terminal is reduced.

However, when electrical testing of a semiconductor device is performed using the above-described probe testing method, the heights of the spherical connection terminals vary. Thereby, a case may occur where connection between the projecting end of the probe and the spherical connection terminal is not sufficient. As a result, the testing accuracy may be degraded.

Further, even though each probe has the U-shaped bent portion, when the projecting end of the probe contacts the spherical connection terminal, the spherical connection terminal, made of solder, may be deformed.

SUMMARY OF THE INVENTION

The present invention has been devised in consideration of the above-described problems. An object of the present invention is to provide a semiconductor testing device which can perform the test of a device having the spherical connection terminals, with high reliability, without deformation of the spherical terminals.

A semiconductor testing device, according to the present invention, for testing a semiconductor device which has at least one spherical connection terminal, comprises:

- an insulating substrate having an opening formed therein at a position corresponding to the position of the spherical connection terminal; and
- a contact member, formed on the insulating substrate, comprising a connection portion which is connected with the spherical connection terminal, at least the connection portion being deformable and extending on the opening.

In this arrangement, even when the heights of the spherical connection terminals vary, the variation of the heights of the spherical connection terminals can be accommodated as a result of the connection terminals being appropriately deformed. Thereby, it is possible that all the spherical connection terminals are positively connected with the contact members, respectively. Thus, the reliability of the test can be improved.

Further, during the deformation of the connection portions when the connection portions are connected with the spherical connection terminals, respectively, the spherical connection terminals slide on the connection portions. Thereby, even if oxide film and/or dust are present on the surfaces of the spherical connection terminals and the connection portions, the oxide film and/or dust are removed as a result of the sliding contact.

A semiconductor testing device, according to another aspect of the present invention, which device is used for performing a test on a semiconductor device having spherical connection terminals, comprises:

- a contactor, provided with a single layer of insulating substrate, in which substrate an opening is formed at a position corresponding to a respective one of the spherical connection terminals, the contactor also being provided with a contact portion, which includes a connection portion with which the respective one of the spherical connection terminals is electrically connected, the contact portion being provided on the single layer of insulating substrate so that the connection portion is located on the opening; and a wiring substrate, on which the contactor is mounted in a manner which permits installation and removal of the contactor onto and from the wiring substrate, the wiring substrate being provided with a first connection terminal which is provided on a first surface, on which the contactor is mounted, and is electrically connected with the contact portion, a second connection terminal which is provided on a second surface, which is opposite to the first surface, and is connected externally, and an interposer which electrically connects the first connection terminal with the second connection terminal.

In this arrangement, the contact portion and the opening are provided at the position of the insulating substrate facing the spherical connection terminal, and the wiring substrate for passing an electric signal from the semiconductor device therethrough is provided below the insulating substrate. Therefore, when the semiconductor device is loaded on the contactor, the spherical connection terminal is connected with the contact portion, and is electrically connected with the first connection terminal provided on the wiring substrate via the contact portion.

Further, the first connection terminal is electrically connected with the second connection terminal which acts as an external connection terminal via the interposer. Therefore, by arbitrarily arranging the interposer, it is possible to arbitrarily set a wiring path which electrically connects the first connection terminal with the second connection terminal.

Thus, the wiring path between the contact portion and the second connection terminal is provided not in the contactor but in the wiring substrate. Thereby, it is not necessary to provide a multilayer contactor, and a single-layer contactor can be used. As a result, it is possible to reduce the cost of the contactor. Thereby, when the contact portion is degraded as a result of a test being performed repetitively, and, thereby, replacement of the contactor is necessary, the replacement can be performed at a low cost. Thus, it is possible to reduce the cost required for the maintenance.

The contact portion provided on the contactor causes the electric signal to flow therethrough from the semiconductor device to the wiring substrate below the insulating substrate directly. As a result, even when the pitch of the spherical connection terminals is reduced, it is possible to shorten the length of the wiring, and, also, it is possible to simplify the wiring arrangement. As a result, it is possible to use the semiconductor testing device in a high-speed electric test.

Other objects and further features of the present invention will become more apparent from the following detailed description when read in conjunction with the accompanying drawings.

BRIEF DESCRIPTION OF THE DRAWINGS

FIGS. 40A and 40B illustrate a fifth variant example of a contact portion;

FIGS. 41A and 41B illustrate a sixth variant example of a contact portion;

FIGS. 44A and 44B illustrate a ninth variant example of a contact portion;

FIGS. 45A and 45B illustrate a tenth variant example of a contact portion;

DETAILED DESCRIPTION OF THE PREFERRED EMBODIMENTS

U.S. patent application Ser. No. 09/009,261, filed on Jan. 20, 1998, now abandoned, is incorporated herein by reference.

Embodiments of the present invention will be described with reference to figures.

Figure 1:
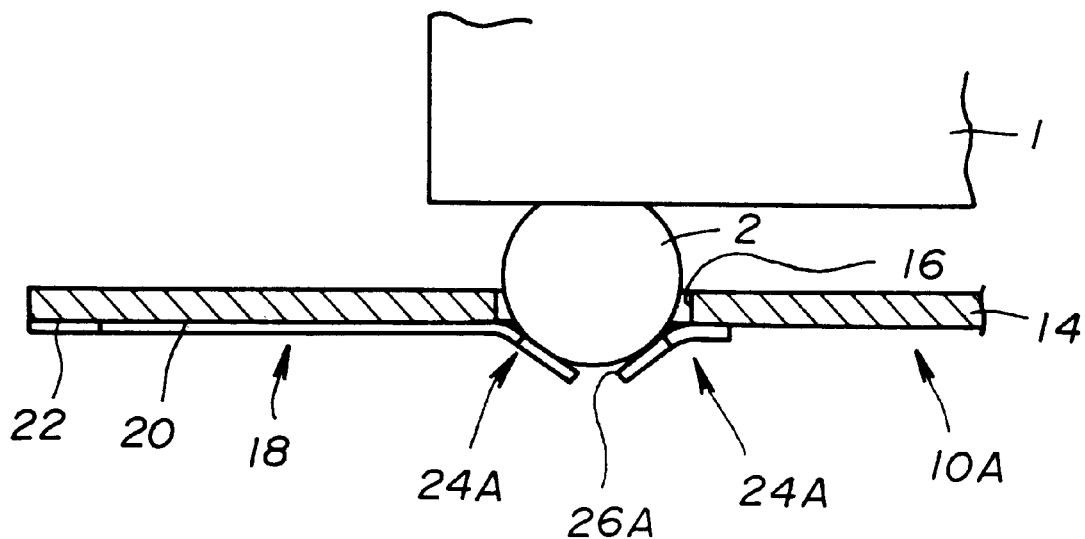
FIGS. 1 and 2 illustrate a semiconductor testing device in a first embodiment of the present invention.
Figure 2:
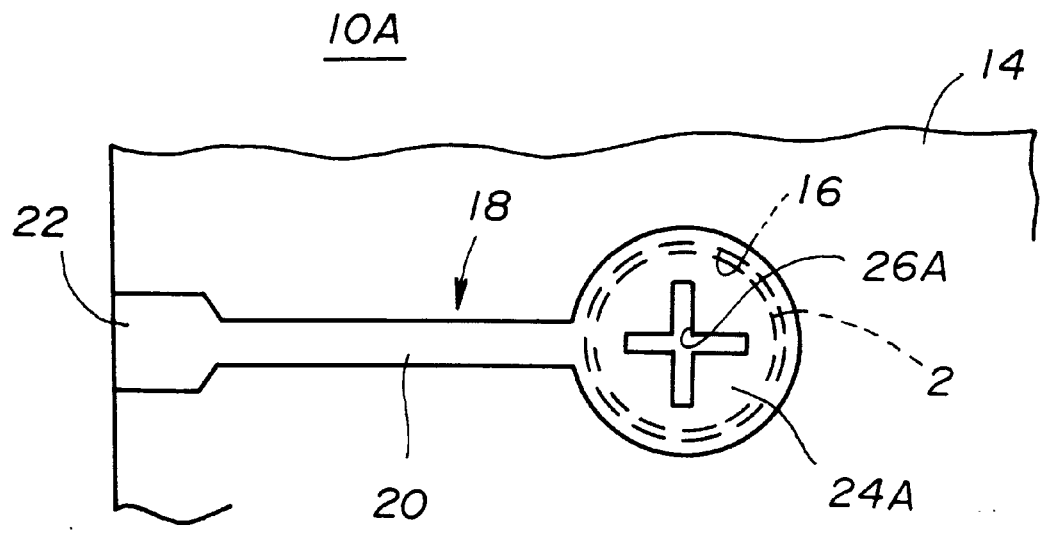

FIGS. 1 and 2 illustrate a semiconductor testing device 10A in a first embodiment of the present invention. FIG. 1 shows a side sectional elevation view of part of the semiconductor testing device 10A. FIG. 2 shows a bottom view of part of the semiconductor testing device 10A. Generally, the semiconductor testing device 10A in the first embodiment has an insulating substrate 14 and contact members 18.

As shown in FIG. 1, a semiconductor device 1 is loaded on the semiconductor testing device 10A. In this loaded state, the semiconductor testing device 10A performs an electrical operational test of the semiconductor device 1. The devices on which the semiconductor testing device 10A performs the test are semiconductor devices such as the semiconductor device 1 which has the spherical connection terminal 2 (hereinafter, referred to as a 'bump').

In the following descriptions, examples using the semiconductor device 1 having the bump 2 will be mainly described. However, semiconductor testing devices in respective embodiments which will be described now can be applied to various devices (for example, a bare chip, a wafer, and so forth).

The semiconductor testing device 10A will now be described in detail.

The insulating substrate 14 is a film member made of an insulating resin material such as a polyimide or the like. The insulating substrate 14 is slightly flexible. A plurality of openings 16 are formed in the insulating substrate 14. The positions of the openings 16 correspond to the positions of the bumps 2 formed on the semiconductor device 1, respectively.

Accordingly, in a condition where the semiconductor device 1 is correctly positioned over the insulating substrate 14, each bump 2 of the semiconductor device 1 faces a respective one of the openings 16 of the insulating substrate 14. Further, the diameter of each opening 16 is set to be slightly larger than the diameter of each bump 2. Accordingly, when the semiconductor device 1 is loaded on the semiconductor testing device 10A, the openings 16 function as guiding holes for the bumps 2.

Each contact member 18 is made of, for example, a copper (Cu) film, and is formed to have a predetermined pattern using a thin-film forming technique such as a plating method, an evaporation method, an etching method, a photolithography technique or the like. Each contact member 18 includes an integrally formed wiring portion 20, a terminal portion 22, a connection portion 24A and so forth.

Figure 3:
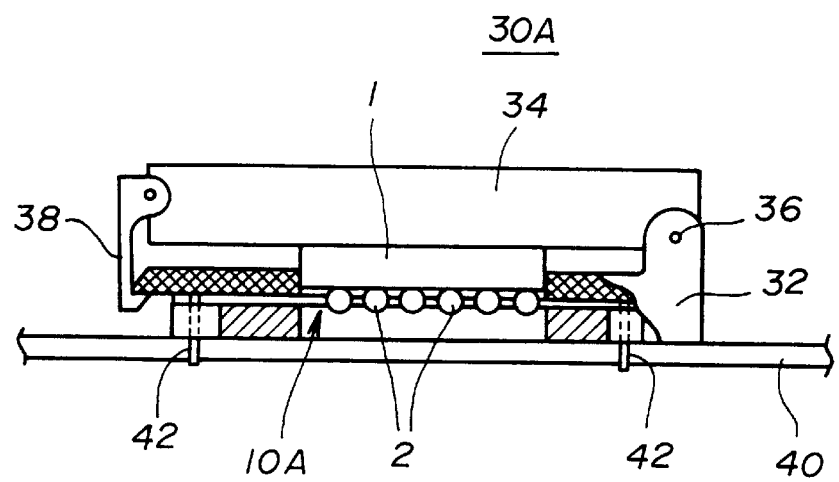
FIG. 3 shows a testing socket to which the semiconductor testing device in the first embodiment is applied.

The terminal portion 22 is, for example, a portion with which a connection pin 42, shown in FIG. 3, is connected. Each connection pin 42 connects a testing board 40 and the semiconductor testing device 10A with one another. Normally, each terminal portion 22 is located in proximity to an edge of the insulating substrate 14. The connection portions 24A are portions which are electrically connected with the bumps 2 of the semiconductor device 1. Therefore, the connection portions 24A are provided at the positions which correspond to the positions of the bumps 2 of the semiconductor device 1, respectively. Each of the wiring portions 20 connects a respective one of the terminal portions 22 and a respective one of the connection portions 24A with one another.

The outline shape of each connection portion 24A is approximately circular and corresponds to the shape of each bump 2. An opening 26A is formed in each connection portion 24A at the center thereof. In the first embodiment, the shape of the opening 26A is a cross. Because the positions of the connection portions 24A correspond to the positions of the bumps, as mentioned above, the positions of the openings 16 formed in the insulating substrate 14 correspond to the positions of the connection portions 24A, respectively.

That is, the insulating substrate 14 is not present at the position of each connection portion 24A, and thus, each connection portion 24A is exposed through a respective one of the openings 16. Accordingly, when the semiconductor device 1 is loaded on the semiconductor testing device 10A, the bumps 2 are electrically connected with the connection portions 24A through the openings 16, respectively, as shown in FIG. 1.

As mentioned above, the insulating substrate 14 is not present at the position of each connection portion 24A, and the opening 26A is formed in each connection portion 24A at the center thereof. Accordingly, as a result of the connection portions 24A being pressed by the bumps 2, each connection portion 24A is easily deformed.

A method for performing a test on the semiconductor device 1 using the semiconductor testing device 10A will now be described.

First, the semiconductor device 1 is positioned with respect to the semiconductor testing device 10A so that the bumps 2 of the semiconductor device 1 are aligned with the connection portions (openings 16) of the semiconductor testing device 10A. Then, as a result of pressing the semiconductor device 1 onto the semiconductor testing device 10A, the bumps 2 are connected with the connection portions 24A. Thus, the semiconductor device 1 is loaded on the semiconductor testing device 10A. A semiconductor tester (not shown in the figures) is connected with the semiconductor testing device 10A. In the state in which the semiconductor device 1 is loaded on the semiconductor testing device 10A, an electrical operational test is performed on the semiconductor device 1 through the semiconductor tester.

Thus, the work of loading the semiconductor device 1 on the semiconductor testing device 10A is very simple and easily performed.

Further, as mentioned above, each connection portion 24A with which a respective one of the bumps 2 is connected is deformable. Accordingly, even if the sizes (heights) of the bumps 2 vary, as a result of the connection portions 24A being deformed, the variation of the heights of the bumps 2 is accommodated, and thus, it is possible that all the bumps 2 are positively connected with the connection portions 24A (contact members 18), respectively. Thus, the reliability of the test can be improved.

Further, as shown in FIG. 1, each connection portion 24A is deformed when the connection portions 24A are connected with the bumps 2, respectively. During the deformation of the connection portions 24A, the bumps 2 slide on the connection portions 24A. Thereby, even if an oxide film and/or dust are present on the surfaces of the bumps 2 and the connection portions 24A, the oxide film and/or dust are removed as a result of the sliding contact. Such an effect is called a wiping effect.

Thereby, it is possible to make the surfaces of the bumps 2 and the connection portions 24A clean when the semiconductor device 1 is loaded on the semiconductor testing device 10A. As a result, it is possible to improve the test accuracy. Further, when the semiconductor device 1 is mounted on a circuit substrate after the test, the reliability of the electrical connection between the semiconductor device 1 and the circuit substrate can be improved.

Further, as shown in FIG. 1, each connection portion 24A is deformed along the outer surface of a respective one of the bumps 2 when the semiconductor device 1 is loaded on the semiconductor testing device 10A. Thereby, the contact area between the connection portion 24A and the bump 2 increases. Thus, it is possible to ensure the electrical connection therebetween. The above-mentioned effects/advantages provided in the first embodiment are similarly provided in each of the other embodiments described later.

FIG. 3 shows an arrangement in which the semiconductor testing device 10A is applied to a testing socket 30A which is used when the semiconductor device 1 is tested. The semiconductor testing device 10A is set in a body portion 32 of the testing socket 30A. A lid portion 34 is rotatably supported on the body portion 32 by a shaft 36. This lid portion 34 is locked in a closed position by a locking pin 38. FIG. 3 shows the condition in which the lid portion 34 is locked in the closed position.

In this locked condition, the lid portion 34 presses the semiconductor device 1 onto the semiconductor testing device 10A. Thereby, as described above, the bumps 2 formed on the semiconductor device 1 are connected with the connection portions 24A formed on the semiconductor testing device 10A. The semiconductor testing device 10A is connected with the testing board 40 through the terminal portions 22 and the connection pins 42. In this condition, a predetermined test can be performed on the semiconductor device 1 through the testing board 40.

Figure 4:
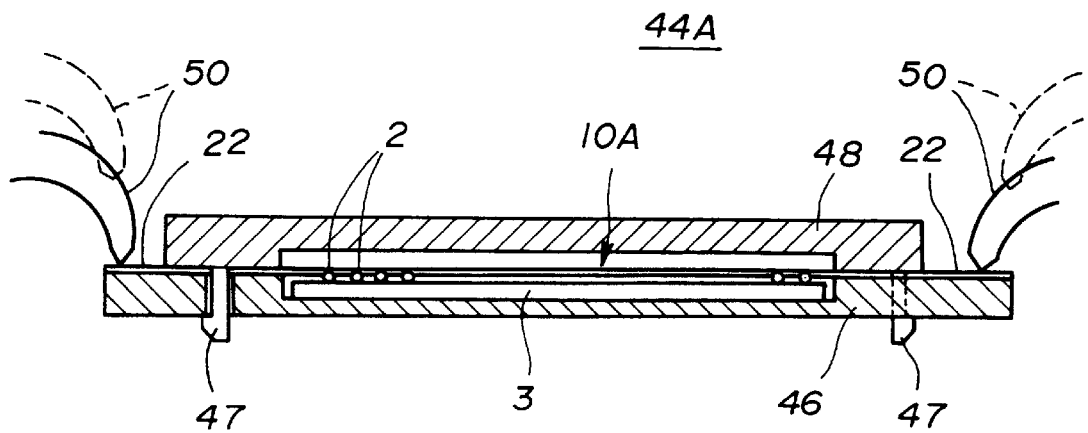
FIGS. 4 and 5 show wafer contactors to which the semiconductor testing device in the first embodiment is applied.
Figure 5:
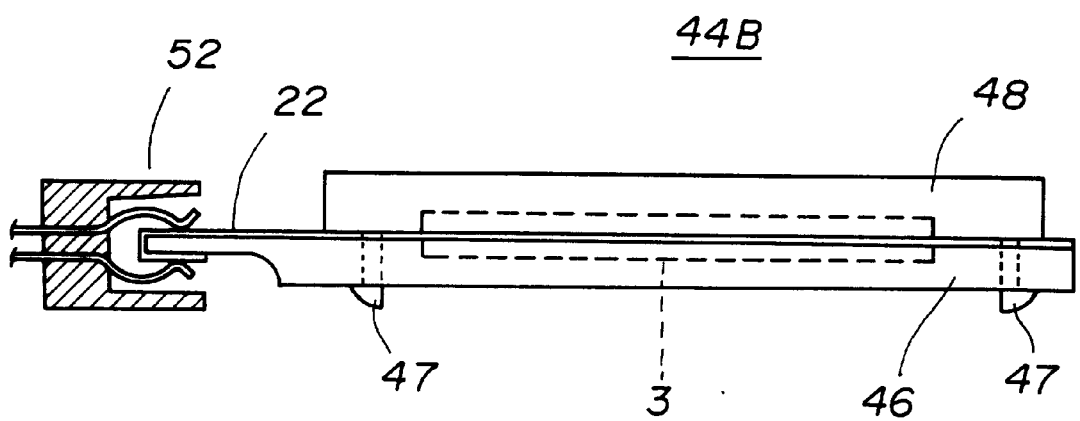

The semiconductor testing device 10A in the first embodiment can be applied not only to the test of the semiconductor device 1 using the arrangement shown in FIG. 3 but also to wafer contactors 44A and 44B shown in FIGS. 4 and 5, respectively.

These wafer contactors 44A and 44B are used when a test is performed on a wafer 3 on which a predetermined electronic circuit is formed and then bumps 2 are formed. Each of the wafer contactors 44A and 44B includes a wafer holder 46 for holding the wafer 3 and a base 48.

The wafer 3 is set in the wafer holder 46 in a position in which the bumps 2 of the wafer 3 project upward, and then, the semiconductor testing device 10A is loaded on the wafer 3. Then, the base 48 is placed on the semiconductor testing device 10A. Hooks 47, projecting downwardly from the base 48, pass through through holes formed in the wafer holder 46, and the projecting ends of the hooks 47 engage with the bottom surface of the wafer holder 46. Thus, the base 48 is locked with the wafer holder 46. Thereby, the base 48 presses the semiconductor testing device 10A onto the wafer 3. When the locking of the base 48 with the wafer holder 46 is released, each of the hooks 47 is laterally bent and thereby, the engagement between the bottom surface of the wafer holder 46 and the projecting end of the hook 47 is released.

Because the base 48 is smaller than the wafer holder 46, the terminal portions 22 of the semiconductor testing device 10A are externally exposed. In the wafer contactor 44A shown in FIG. 4, contacts 50 are electrically connected with the exposed terminal portions 22, respectively. In the wafer contactor 44B shown in FIG. 5, connector 52 is electrically connected with the exposed terminal portions 22. In this condition, a test is performed on the wafer 3. Thus, the semiconductor testing device 10A can also be applied to the test of the wafer 3 in the arrangements shown in FIG. 4 and FIG. 5. In each of the arrangements shown in FIGS. 4 and 5, advantages similar to those described above can be provided. This can also be said for the other embodiments described later.

A second embodiment of the present invention will now be described.

Figure 6A:
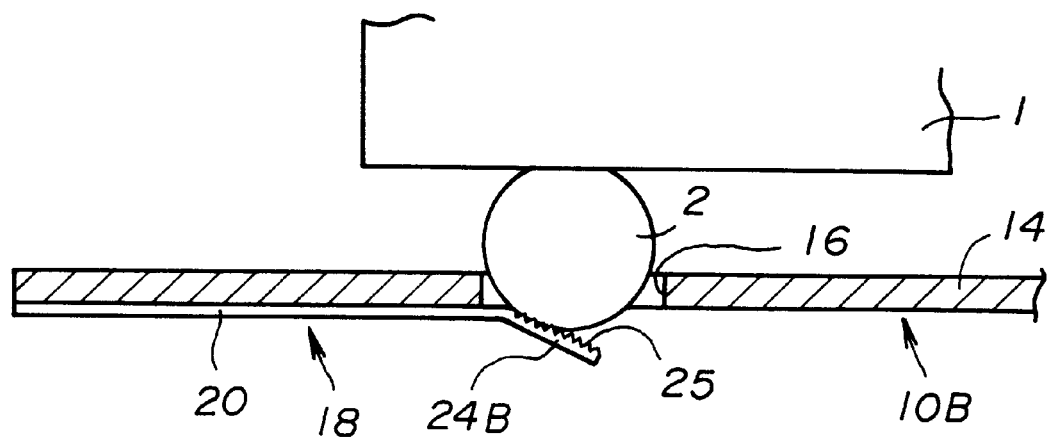
FIGS. 6A and 6B illustrate a semiconductor testing device in a second embodiment of the present invention.
Figure 6B:
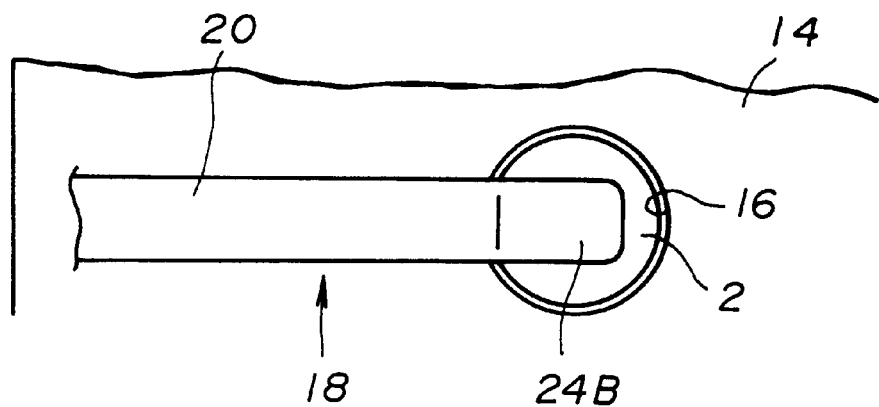

FIGS. 6A and 6B show a semiconductor testing device 10B in the second embodiment of the present invention. FIG. 6A shows a side sectional elevation view of part of the semiconductor testing device 10B. FIG. 6B shows a bottom view of part of the semiconductor testing device 10B. In FIGS. 6A and 6B, for the components/parts identical to those of the semiconductor testing device 10A shown in FIGS. 1 and 2, the same reference numerals are given and the descriptions thereof will be omitted. Hereinafter, although each semiconductor testing device has a plurality of contact members 18, descriptions will be made mainly for only one contact member 18 for the sake of simplification of descriptions.

In the semiconductor testing device 10B in the second embodiment, a connection portion 24B extends from only one side of the opening 16 so as to have a cantilever-like shape. Further, a roughened surface 25 is formed at least at an area of the connection portion 24B, at which area the connection portion 24B is connected with the bump 2.

As a result of the connection portion 24B having the cantilever-like shape, possible deformation of the connection portion 24B can be increased. Thereby, even if the variation in the heights of the bumps 2 is large, this can be easily accommodated. Thereby, a highly reliable test can be performed. Further, because the possible deformation of the connection portion 24B is large, the contact area between the connection portion 24B and the bump 2 increases. Thus, it is possible to ensure the electrical connection therebetween.

Further, also by forming the roughened surface 25 at least at the area at which the connection portion 24 is connected with the bump 2, it is possible to ensure the electrical connection therebetween. The roughened surface 25 has minute unevenness thereon, and thus, the effective surface area is large. When the bump 2 comes into contact with the connection portion 24B, the minute projections of the roughened surface protrude into the bump 2. Thereby, electrical connection between the connection portion 24B and the bump 2 can be ensured.

The roughened surface 25 is formed by, for example, a method of treating the surface of the connection portion 24B with chemicals, by blasting or the like.

A third embodiment of the present invention will now be described.

Figure 7A:
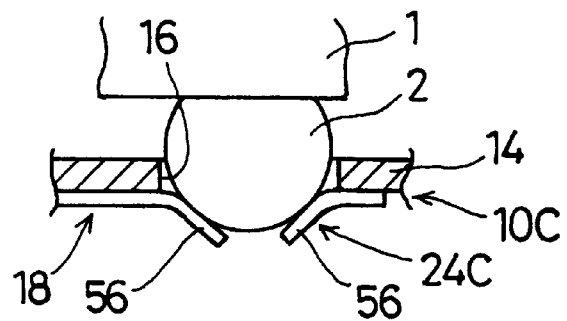
FIGS. 7A and 7B illustrate a semiconductor testing device in a third embodiment of the present invention.
Figure 7B:
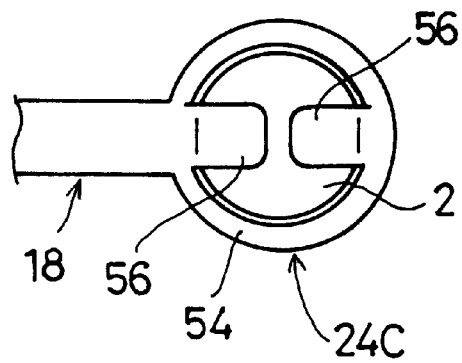

FIGS. 7A and 7B show a semiconductor testing device 10C in the third embodiment of the present invention. FIG. 7A shows a side sectional elevation view of part of the semiconductor testing device 10C. FIG. 7B shows a bottom view of part of the semiconductor testing device 10C. Also in FIGS. 7A and 7B, for the components/parts identical to those of the semiconductor testing device 10A shown in FIGS. 1 and 2, the same reference numerals are given and the descriptions thereof will be omitted.

In the semiconductor testing device 10C in the third embodiment, a connection portion 24C includes one pair of cantilever portions 56. Specifically, the connection portion 24C includes a ring portion 54, and, as shown in FIG. 7B, the pair of cantilever portions 56 extend from opposite sides of the ring portion 54 toward the center of the ring portion.

The possible amount of deformation of the cantilever portions 56, when the semiconductor device 1 is loaded on the semiconductor testing device 10C and the bump 2 presses the cantilever portions 56, is larger than the case of the connection portion 24A in the first embodiment, and is smaller than the case of the connection portion 24B in the second embodiment. Accordingly, when the heights of the bumps 2 vary, one of the first, second and third embodiments may be appropriately selected.

Further, in the third embodiment, since the cantilever portions 56 come into contact with the bump 2 on two sides as shown in FIG. 7A, it is possible to hold the bump 2 more stably in comparison to the case of the second embodiment. Further, in comparison to the first embodiment, the mechanical strength of the connection portion 24C can be increased, and thus, occurrence of plastic deformation of the connection portion 24C can be prevented.

A fourth embodiment of the present invention will now be described.

Figure 8A:
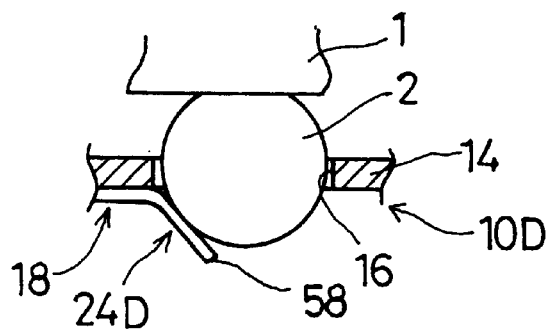
FIGS. 8A and 8B illustrate a semiconductor testing device in a fourth embodiment of the present invention.
Figure 8B:
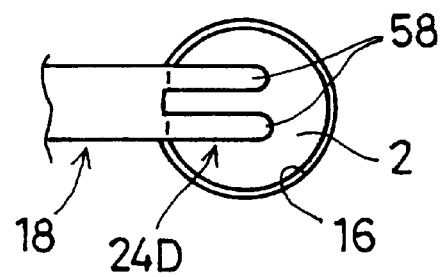

FIGS. 8A and 8B show a semiconductor testing device 10D in the fourth embodiment of the present invention. FIG. 8A shows a side sectional elevation view of part of the semiconductor testing device 10D. FIG. 8B shows a bottom view of part of the semiconductor testing device 10D. Also in FIGS. 8A and 8B, for the components/parts identical to those of the semiconductor testing device 10A shown in FIGS. 1 and 2, the same reference numerals are given and the descriptions thereof will be omitted.

In the second embodiment, the connection portion 24B has a flat-plate cantilever shape. In contrast to this, in the semiconductor testing device 10D in the fourth embodiment, a connection portion 24D is a forked cantilever portion 58. In comparison to the connection portion 24B in/the second embodiment, the connection portion 24D is more likely to be deformed. Thereby, the variation of the heights of the bumps 2 can be effectively accommodated.

However, because the connection portion 24D is likely to be deformed, in a case where the contact member 18 is made of copper (Cu), plastic deformation of the connection portion 24D is likely to occur. Accordingly, in the fourth embodiment, it is preferable that the contact portion 18 (including the connection portion 24D) is made of a material which has elasticity and also high electric conductivity.

A fifth embodiment of the present invention will now be described.

Figure 9A:
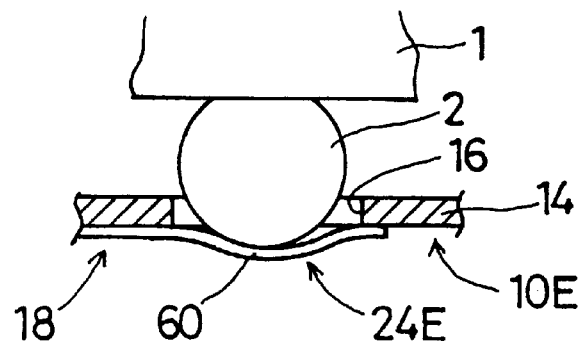
FIGS. 9A and 9B illustrate a semiconductor testing device in a fifth embodiment of the present invention.
Figure 9B:
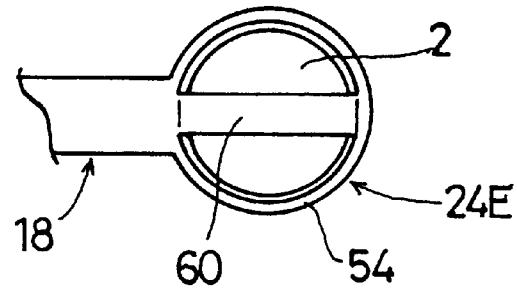

FIGS. 9A and 9B show a semiconductor testing device 10E in the fifth embodiment of the present invention. FIG. 9A shows a side sectional elevation view of part of the semiconductor testing device 10E. FIG. 9B shows a bottom view of part of the semiconductor testing device 10E. Also in FIGS. 9A and 9B, for the components/parts identical to those of the semiconductor testing device 10A shown in FIGS. 1 and 2, the same reference numerals are given and the descriptions thereof will be omitted.

In the semiconductor testing device 10B–10D in the second through fourth embodiments, each of the connection portions 24B–24D has a cantilever shape. In contrast to this, in the semiconductor testing device 10E in the fifth embodiment, a connection portion 24E includes a portion 60 supported on both ends. Each of the both ends of the portion 60 is integrally connected with a ring portion 54.

By using the portion 60 supported on both ends, the mechanical strength of the connection portion 20E can be increased. Thereby, the connection portion 20E can be prevented from being degraded due to long-term use.

A sixth embodiment of the present invention will now be described.

Figure 10A:
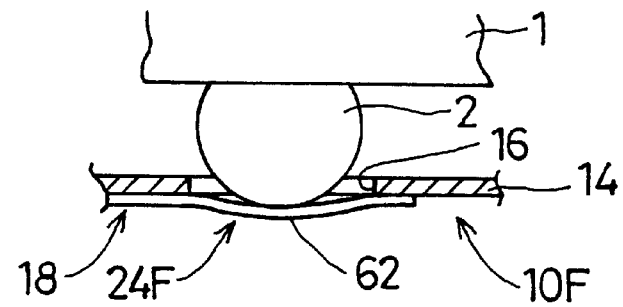
FIGS. 10A and 10B illustrate a semiconductor testing device in a sixth embodiment of the present invention.
Figure 10B:
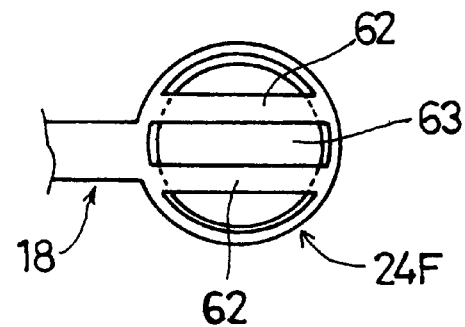

FIGS. 10A and 10B show a semiconductor testing device 10F in the sixth embodiment of the present invention. FIG. 10A shows a side sectional elevation view of part of the semiconductor testing device 10F. FIG. 10B shows a bottom view of part of the semiconductor testing device 10F. Also in FIGS. 10A and 10B, for the components/parts identical to those of the semiconductor testing device 10A shown in FIGS. 1 and 2, the same reference numerals are given and the descriptions thereof will be omitted.

In the sixth embodiment, a connection portion 24F is obtained as a result of forming an opening 63 at the center line of the portion 60 of the connection portion 24E in the fifth embodiment. Thus, a pair of portions 62, each supported at both ends, are formed.

By forming the pair of portions 62 in the connection portion 24F, the amount of deformation of the portions 62 can be increased. Thereby, variation in the heights of the bumps 2 can be effectively accommodated.

Further, by providing the opening 63 between the portions 62, the bottom-end portion of the bump 2 is located in the opening 63. Thereby, movement of the bump 2 on the connection portion 24F can be prevented. Accordingly, the semiconductor device 1 can be positively positioned on the semiconductor testing device 10F.

A seventh embodiment of the present invention will now be described.

Figure 11A:
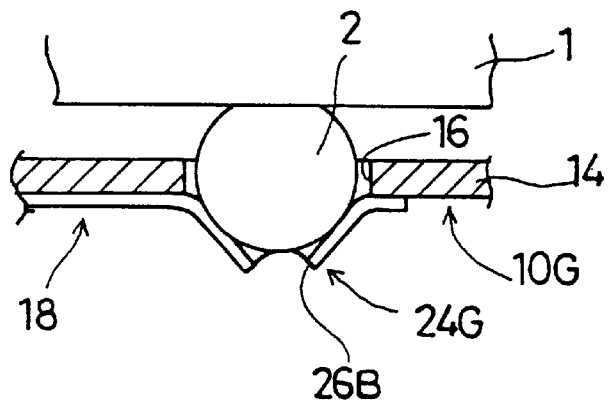
FIGS. 11A and 11B illustrate a semiconductor testing device in a seventh embodiment of the present invention.
Figure 11B:
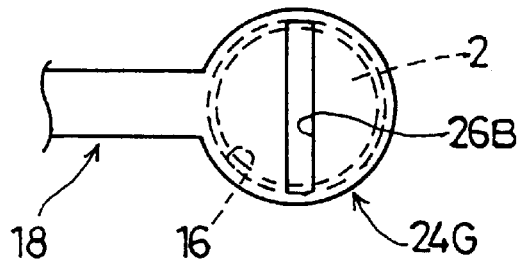

FIGS. 11A and 11B show a semiconductor testing device 10G in the seventh embodiment of the present invention. FIG. 11A shows a side sectional elevation view of part of the semiconductor testing device 10G. FIG. 11B shows a bottom view of part of the semiconductor testing device 10G. Also in FIGS. 11A and 11B, for the components/parts identical to those of the semiconductor testing device 10A shown in FIGS. 1 and 2, the same reference numerals are given and the descriptions thereof will be omitted.

In the above-described first embodiment, the cross-shaped opening 26A is formed at the center of the connection portion 24A so that the connection portion 24A is deformable. In contrast to this, in the seventh embodiment, a straight-line slit 26B is formed in a connection portion 24G of the semiconductor testing device 10G so that the connection portion 24G is deformable.

The possible amount of deformation of the connection portion 24G in the seventh embodiment is less than the possible amount of deformation of the connection portion 24A in the first embodiment. However, the mechanical strength of the connection portion 24G is higher than that of the connection portion 24A. Accordingly, in accordance with the material of the bump 2 (for example, whether the bump 2 is made of solder or gold, and so forth), an appropriate one of the slits 26A and 26B may be selected.

In the seventh embodiment, the connection portion can be easily deformed. As a result, the variation of the heights of the bumps can be accommodated as a result of the connection portion being appropriately deformed. Further, because the contact area between the connection portion and the bump is increased, a positive electrical connection can be provided.

An eighth embodiment of the present invention will now be described.

Figure 12A:
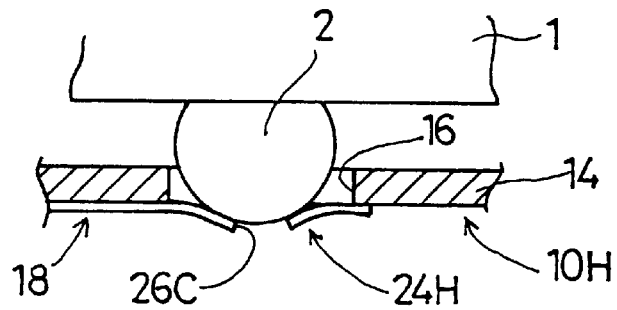
FIGS. 12A and 12B illustrate a semiconductor testing device in an eighth embodiment of the present invention.
Figure 12B:
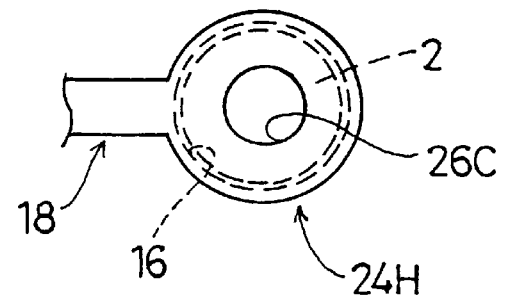

FIGS. 12A and 12B show a semiconductor testing device 10H in the eighth embodiment of the present invention. FIG. 12A shows a side sectional elevation view of part of the semiconductor testing device 10H. FIG. 12B shows a bottom view of part of the semiconductor testing device 10H. Also in FIGS. 12A and 12B, for the components/parts identical to those of the semiconductor testing device 10A shown in FIGS. 1 and 2, the same reference numerals are given and the descriptions thereof will be omitted.

In the eighth embodiment, a circular opening 26C is formed at the center of a connection portion 24H. The possible amount of deformation of the connection portion 24H is less than that of the connection portion 24G in the seventh embodiment, while the mechanical strength of the connection portion 24H is higher than the connection portion 24G. Accordingly, as mentioned above, an appropriate one of the slits 26A, 26B and the opening 26C may be selected. Further, in the eighth embodiment, because the opening 26C is located at the center of the connection portion 24H and also has a circular shape, the bump 2 is always located at the center of the connection portion 24H. Accordingly, the semiconductor device 1 can be positively positioned on the semiconductor testing device 10H.

In the eighth embodiment, the connection portion can be easily deformed. As a result, the variation of the heights of the bumps can be accommodated as a result of the connection portion being appropriately deformed. Further, because the contact area between the connection portion and the bump is increased, a positive electrical connection can be provided.

A ninth embodiment of the present invention will now be described.

Figure 13A:
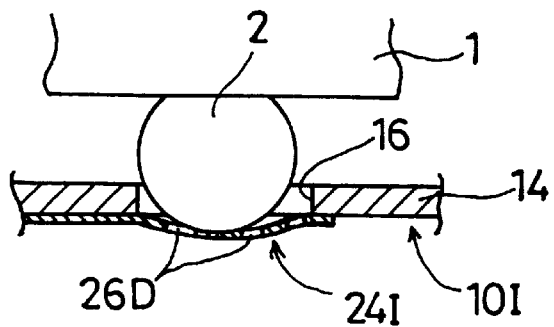
FIGS. 13A and 13B illustrate a semiconductor testing device in a ninth embodiment of the present invention.
Figure 13B:
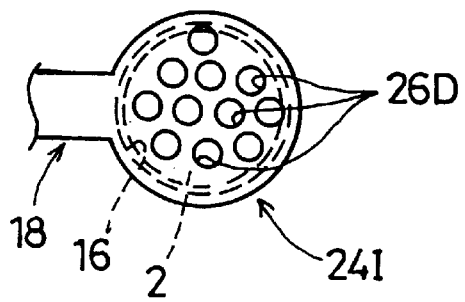

FIGS. 13A and 13B show a semiconductor testing device 10I in the ninth embodiment of the present invention. FIG. 13A shows a side sectional elevation view of part of the semiconductor testing device 10I. FIG. 13B shows a bottom view of part of the semiconductor testing device 10I. Also in FIGS. 13A and 13B, for the components/parts identical to those of the semiconductor testing device 10A shown in FIGS. 1 and 2, the same reference numerals are given and the descriptions thereof will be omitted.

In the ninth embodiment, many small-diameter circular openings 26D are formed in a connection portion 24I. By forming a large number of circular openings 26D in the connection portion 24I, similar to the above-described embodiments, the connection portion 24I is deformable. The possible amount of deformation can be adjusted by appropriately selecting the number of the circular openings 26D and the diameter of each circular opening 26D.

Further, by forming the large number of circular openings 26D, when the bump 2 is pressed onto the connection portion 24I, the edge of each circular opening 26D cuts into the bump 2. Therefore, the connection portion 24I provides an effect the same as that provided by the roughened surface 25 of the second embodiment. Thereby, electrical connection between the connection portion 24I and the bump 2 can be ensured.

In the ninth embodiment, the connection portion can be easily deformed. As a result, the variation of the heights of the bumps can be accommodated as a result of the connection portion being appropriately deformed. Further, because the contact area between the connection portion and the bump is increased, a positive electrical connection can be provided.

A tenth embodiment of the present invention will now be described.

Figure 14A:
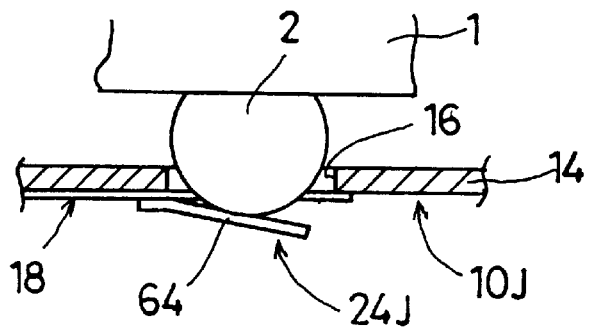
FIGS. 14A and 14B illustrate a semiconductor testing device in a tenth embodiment of the present invention.
Figure 14B:
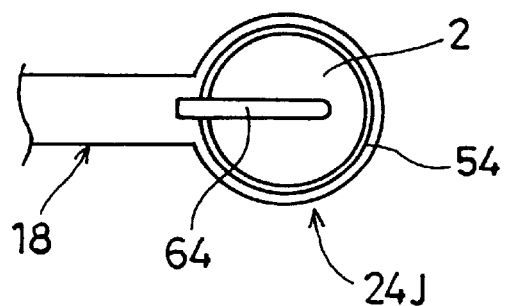

FIGS. 14A and 14B show a semiconductor testing device 10J in the tenth embodiment of the present invention. FIG. 14A shows a side sectional elevation view of part of the semiconductor testing device 10J. FIG. 14B shows a bottom view of part of the semiconductor testing device 10J. Also in FIGS. 14A and 14B, for the components/parts identical to those of the semiconductor testing device 10A shown in FIGS. 1 and 2, the same reference numerals are given and the descriptions thereof will be omitted.

In each of the above-described embodiments, the connection portion is integrally formed in the contact member 18. In contrast to this, in the tenth embodiment, a direct-contact part 64 of a connection portion 24J is a member different from the other portion of the contact member 18.

By using the different member as the direct-contact part 64 of the connection portion 24J, it is possible to separately select the material of the contact member 18 and the material of the direct-contact part 64. Accordingly, it is possible to select a material that is optimum for the function of the contact member 18 and to select a material that is optimum for the function of the direct-contact part 64.

In the semiconductor testing device 10J in the tenth embodiment, in order to set the possible amount of deformation of the direct-contact part 64 of the connection portion 24J to be large, the direct-contact part 64 is a foil-like terminal. In the tenth embodiment, the foil-like terminal 64 (direct-contact part) is made of aluminum (Al), and the other portion of the contact member 18 is made of copper (Cu).

An eleventh embodiment of the present invention will now be described.

Figure 15A:
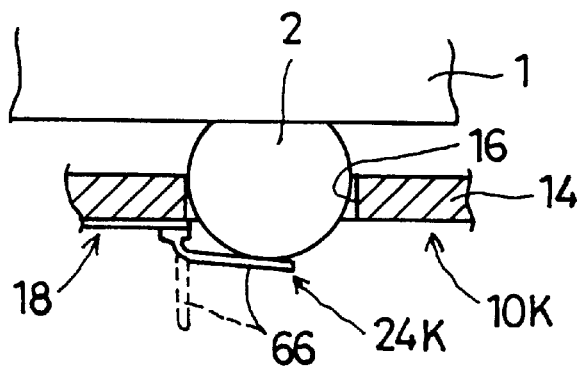
FIGS. 15A and 15B illustrate a semiconductor testing device in an eleventh embodiment of the present invention.
Figure 15B:
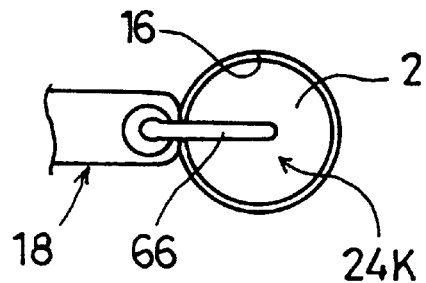

FIGS. 15A and 15B show a semiconductor testing device 10K in the eleventh embodiment of the present invention. FIG. 15A shows a side sectional elevation view of part of the semiconductor testing device 10K. FIG. 15B shows a bottom view of part of the semiconductor testing device 10K. Also in FIGS. 15A and 15B, for the components/parts identical to those of the semiconductor testing device 10A shown in FIGS. 1 and 2, the same reference numerals are given and the descriptions thereof will be omitted.

In the eleventh embodiment, similar to the tenth embodiment, a connection portion 24K is a member different from the other portion of the contact member 18. The connection portion 24K is a direct-contact part which is a cantilever-shaped wire 66.

The cantilever-shaped wire 66 is formed using the wire-bonding technique. Specifically, wire bonding is performed at a position on the contact member 18 in proximity to the opening 16 using a wire-bonding apparatus. Then, after a predetermined length of wire is pulled out, the wire is cut. As a result, the wire is in a condition indicated by the broken line in FIG. 15A.

Then, the wire is bent to the side of the opening 16. Thus, the cantilever-shaped wire 66 is formed (indicated by the solid line in FIG. 15A). By forming the connection portion 24K using the wire-bonding technique, the connection portion 24K is easily and efficiently formed, and also, the cost can be reduced.

Further, in the eleventh embodiment, the connection portion 24K is the cantilever-shaped wire 66, one end of the wire 66 being fixed and the other end of the wire 66 being free. Thereby, the possible amount of deformation of the cantilever-shaped wire 66 is relatively large. As a result, even if the variation of the heights of the bumps 2 is large, the variation can be accommodated.

A twelfth embodiment of the present invention will now be described.

Figure 16A:
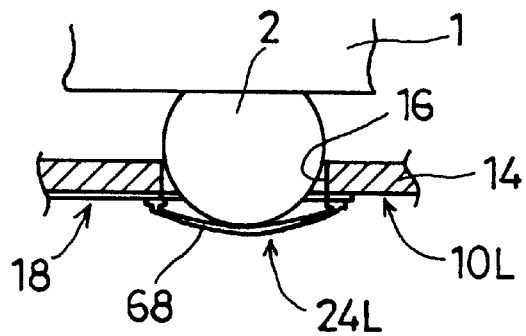
FIGS. 16A and 16B illustrate a semiconductor testing device in a twelfth embodiment of the present invention.
Figure 16B:
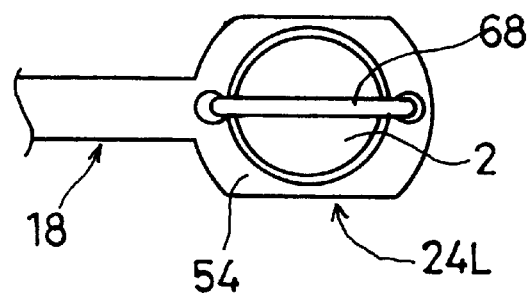

FIGS. 16A and 16B show a semiconductor testing device 10L in the twelfth embodiment of the present invention. FIG. 16A shows a side sectional elevation view of part of the semiconductor testing device 10L. FIG. 16B shows a bottom view of part of the semiconductor testing device 10L. Also in FIGS. 16A and 16B, for the components/parts identical to those of the semiconductor testing device 10A shown in FIGS. 1 and 2, the same reference numerals are given and the descriptions thereof will be omitted.

Also in the twelfth embodiment, similar to the above-described eleventh embodiment, a direct-contact part 68 of the connection portion 24L is a wire. Although the connection portion 24K is the cantilever-shaped wire 66 in the eleventh embodiment, the direct-contact part 68 of the connection portion 24L is a wire supported at both ends in the twelfth embodiment.

The wire 66 supported at both ends is formed also using the wire-bonding technique. Specifically, first bonding is performed at a position on a frame portion 54 of the connection portion 24L in proximity to the opening 16. Then, after the wire is pulled out a predetermined length, second bonding is performed at a position on the frame portion 54 opposite to the position of the first bonding. Thereby, each of the both ends of the wire 68 is fixed to the frame portion 54. The mechanical strength of the connection portion 24L in the twelfth embodiment is higher than that of the connection portion 24L in the eleventh embodiment.

A thirteenth embodiment of the present invention will now be described.

Figure 17:
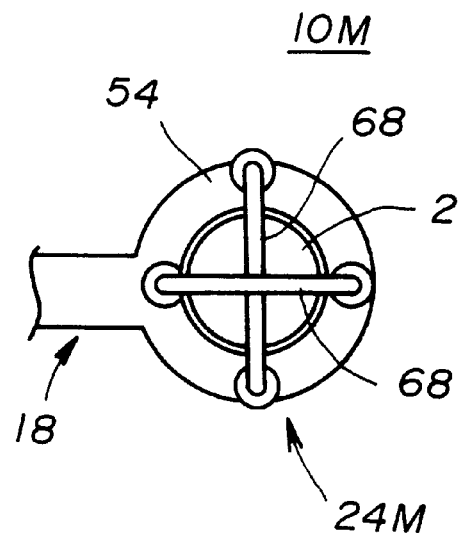
FIG. 17 illustrates a semiconductor testing device in a thirteenth embodiment of the present invention.

FIG. 17 shows a bottom view of part of a semiconductor testing device 10M in the thirteenth embodiment of the present invention. Also in FIG. 17, for the components/parts identical to those of the semiconductor testing device 10A shown in FIGS. 1 and 2, the same reference numerals are given and the descriptions thereof will be omitted.

In the connection portion 24M of the semiconductor testing device 10M, two of the wires 68, each supported at both ends, as described above for the twelfth embodiment, are used. The two wires 68 are arranged so as to form a cross as shown in FIG. 17. In this arrangement in the thirteenth embodiment, the effect provided by the twelfth embodiment can also be provided, and also, in comparison to the arrangements of the eleventh and twelfth embodiments shown in FIGS. 15A, 15B, 16A and 16B, movement of the bump 2 can be prevented. Thereby, the semiconductor device 1 can be positively positioned on the semiconductor testing device 10M.

A fourteenth embodiment of the present invention will now be described.

Figure 18:
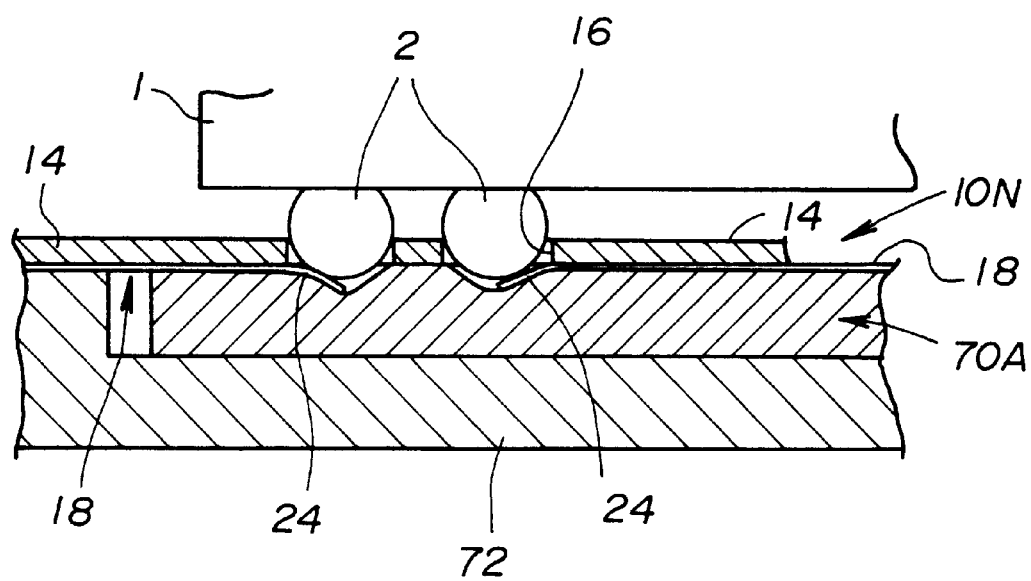
FIG. 18 illustrates a semiconductor testing device in a fourteenth embodiment of the present invention.

FIG. 18 shows part of a semiconductor testing device 10N in the fourteenth embodiment of the present invention. Also in FIG. 18, for the components/parts identical to those of the semiconductor testing device 10A shown in FIGS. 1 and 2, the same reference numerals are given and the descriptions thereof will be omitted.

In the above-described respective embodiments, basically, each of the semiconductor testing devices 10A–10M includes the insulating substrate 14 and the contact member 18. In contrast to this, in the semiconductor testing device 10N in the fourteenth embodiment, in addition to the insulating substrate 14 and the contact member 18, a reinforcement member 70A is provided.

The reinforcement member 70A is made of an elastic member having an insulating property (for example, rubber, flexible resin, or the like). Specifically, a holder 72 is provided in this embodiment. The reinforcement member 70A is provided on the holder 72, and then, the contact member 18 and the insulating substrate 14 are stacked in the stated order.

In order to accommodate the variation of the heights of the bumps 2, it is necessary to form each connection portion 24 to be thin. The contact member 18 is supported on the insulating substrate 14 except for the positions at which the contact member 18 faces the openings 16. Thus, the mechanical strength of the contact member 18 is ensured.

It is necessary that the connection portions 24 are electrically connected with the bumps 2. For this purpose, the openings 16 are formed in the insulating substrate 14 at the positions at which the insulating substrate 14 faces the bumps 2. As a result, the thin connection portions 24 are exposed through the openings 16. Thus, the mechanical strength of the connection portions 24 is decreased.

In the fourteenth embodiment, the reinforcement member 70A supports the connection portions 24. Thereby, even if a strong force is applied to the connection portions 24, the reinforcement member 70A protects the connection portions 24. Thereby, plastic deformation of the connection portions 24 can be prevented. Therefore, a stable test can be always performed.

Further, in the fourteenth embodiment, the holder 72 is provided under the semiconductor testing device 10N. This holder 72 is made of a material having a low elastic deformation rate, such as, for example, metal, hard resin or the like. The holder 72 is provided under the reinforcement member 70A, and supports the reinforcement member 70A.

As a result of providing the holder 72 for supporting the reinforcement member 70A, even if elastic deformation of the reinforcement member 70A occurs when the semiconductor device 1 is loaded on the semiconductor testing device 10N, excessive deformation of the reinforcement member 70A and shifting of the reinforcement member 70A from a predetermined position can be prevented. Thereby, a stable electrical connection between the connection portions 24 and the bumps 2 can be provided.

A fifteenth embodiment of the present invention will now be described.

Figure 19:
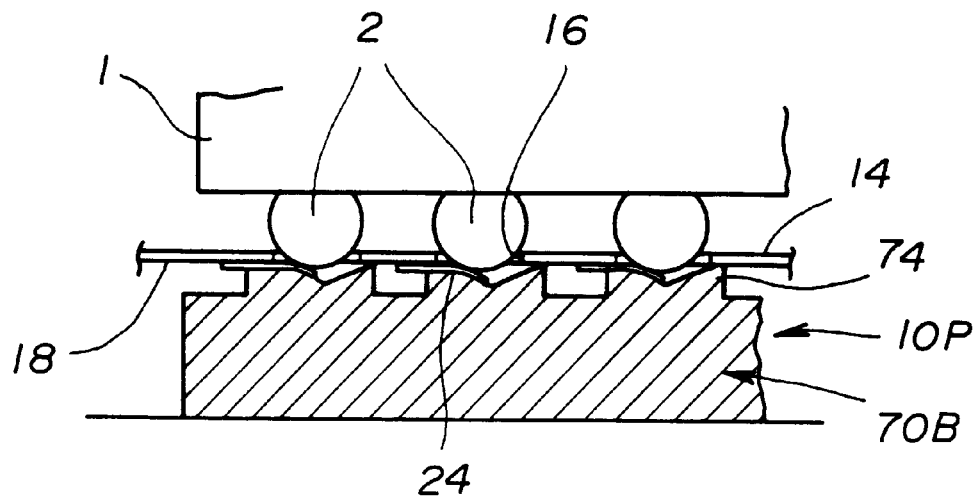
FIG. 19 illustrates a semiconductor testing device in a fifteenth embodiment of the present invention.

FIG. 19 shows part of a semiconductor testing device 10P in the fifteenth embodiment of the present invention. In FIG. 19, for the components/parts identical to those of the semiconductor testing devices 10A and 10N in the first and fourteenth embodiments, shown in FIGS. 1, 2 and 18, the same reference numerals are given and the descriptions thereof will be omitted.

In the semiconductor testing device 10P in the fifteenth embodiment, projections 74 are formed on a reinforcement member 70B at positions at which the reinforcement member 70B faces the connection portions 24.

By forming the projections 74 on the reinforcement member 70B at the positions at which the reinforcement member 70B faces the connection portions 24, the projections 74 are mainly deformed and the other portion of the reinforcement member 70B is not much deformed, when a strong force is applied to the connection portions 24. As a result, excessive deformation of the reinforcement member 70B and shifting of the reinforcement member 70B from a predetermined position can be prevented.

In each of the arrangements shown in FIGS. 18 and 19, when the connection portions 24 are deformed as a result of an external force being applied to the connection portions 24, the reinforcement member 70A or 70B, which is in contact with the connecting portions 24, prevents excess deformation of the connection portions 24. Thus, the connection portions 24 are well protected.

A sixteenth embodiment of the present invention will now be described.

Figure 20:
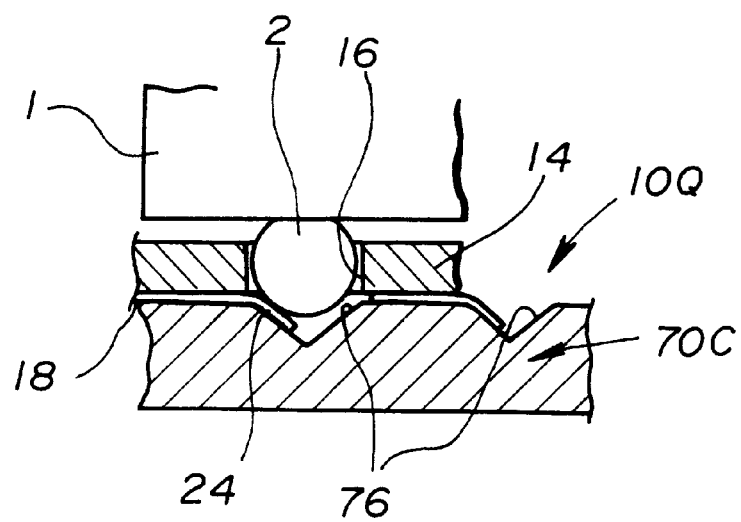
FIG. 20 illustrates a semiconductor testing device in a sixteenth embodiment of the present invention.

FIG. 20 shows part of a semiconductor testing device 10Q in the sixteenth embodiment of the present invention. In FIG. 20, for the components/parts identical to those of the semiconductor testing devices 10A and 10N in the first and fourteenth embodiments, shown in FIGS. 1, 2 and 18, the same reference numerals are given and the descriptions thereof will be omitted.

In the semiconductor testing device 10Q in the sixteenth embodiment, reverse-conical depressions 76 are provided on the reinforcement member 70C at the positions at which the reinforcement member 70C faces the connection portions 24.

By forming the reverse-conical depressions 76 on the reinforcement member 70C at the positions at which the reinforcement member 70C faces the connection portions 24, in addition to the openings 16 formed in the insulating substrate 14, positioning of the bumps 2 can be performed using the reverse-conical depressions 76. Accordingly, positioning of the semiconductor device 1 with respect to the semiconductor testing device 10Q can be positively performed.

Because of the shape of the reverse-conical depression 76, the wall thereof is a taper surface. Accordingly, in comparison to a cylindrical depression or a rectangular depression each having a vertical wall, the connection portion 24 immediately comes into contact with the reinforcement member 70C when the connection portion 24 is deformed. Thereby, it is possible to prevent plastic deformation of the connection portion 24.

A seventeenth embodiment of the present invention will now be described.

Figure 21:
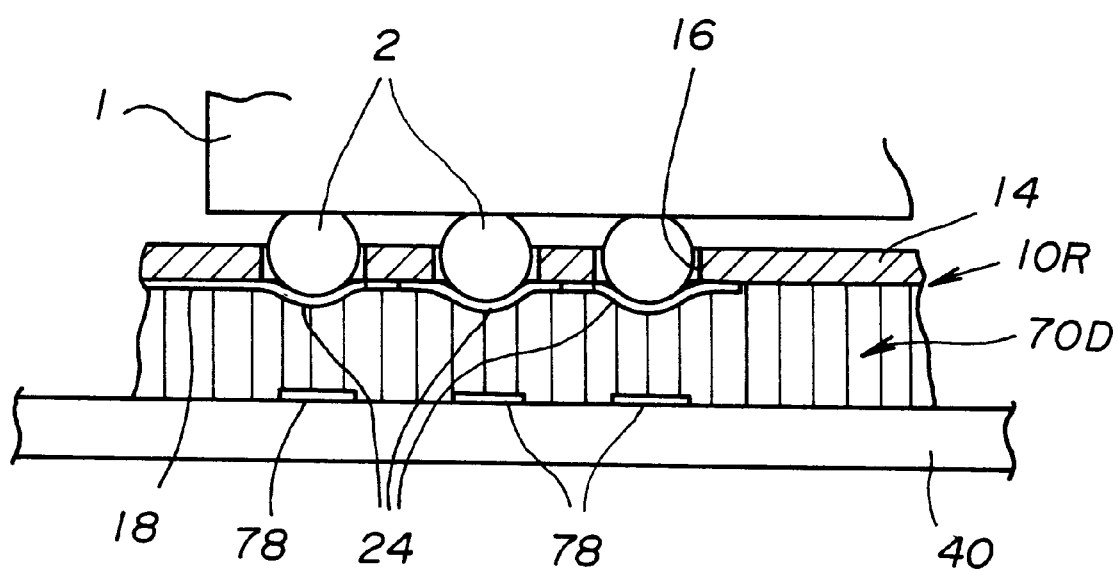
FIG. 21 illustrates a semiconductor testing device in a seventeenth embodiment of the present invention.

FIG. 21 shows part of a semiconductor testing device 10R in the seventeenth embodiment of the present invention. In FIG. 21, for the components/parts identical to those of the semiconductor testing devices 10A and 10N in the first and fourteenth embodiments, shown in FIGS. 1, 2 and 18, the same reference numerals are given and the descriptions thereof will be omitted.

The semiconductor testing device 10R in the seventeenth embodiment uses an anisotropic conductive rubber as a reinforcement member 70D. The anisotropic conductive rubber is made as a result of mixing conductive metal powder into a flexible insulating material, and has characteristics of having conductivity in a pressed direction, that is, in the direction of a force application.

Accordingly, by using the anisotropic conductive rubber as the reinforcement member 70D, the reinforcement member 70D has two functions. The first function is to mechanically reinforce the connection portions 24. The second function is to electrically connect the connection portions 24 with pads 78 provided on the testing board 40. Thereby, plastic deformation of the connection portions 24 can be prevented by the mechanically reinforcing function, and also, various kinds of wiring of the semiconductor testing device 10R can be performed by the electrically conductive function.

An eighteenth embodiment of the present invention will now be described.

Figure 22A:
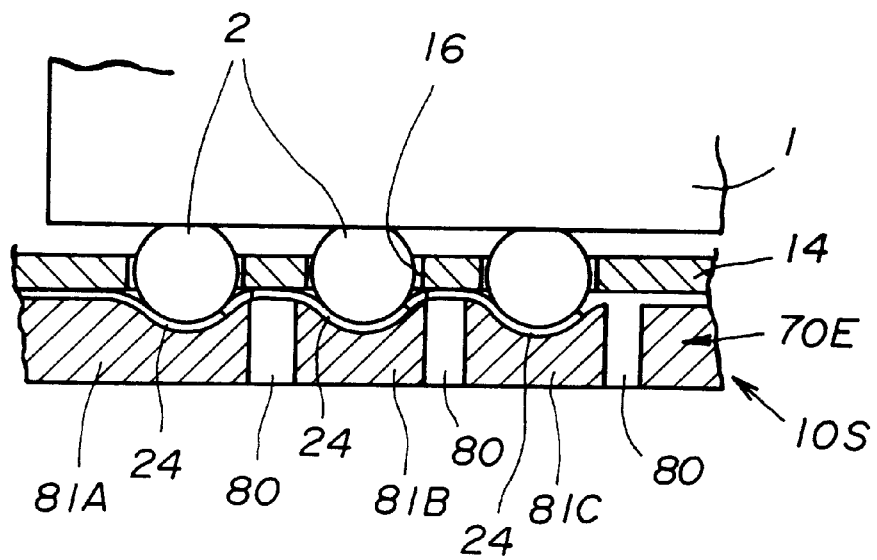
FIGS. 22A and 22B illustrate a semiconductor testing device in a eighteenth embodiment of the present invention.
Figure 22B:
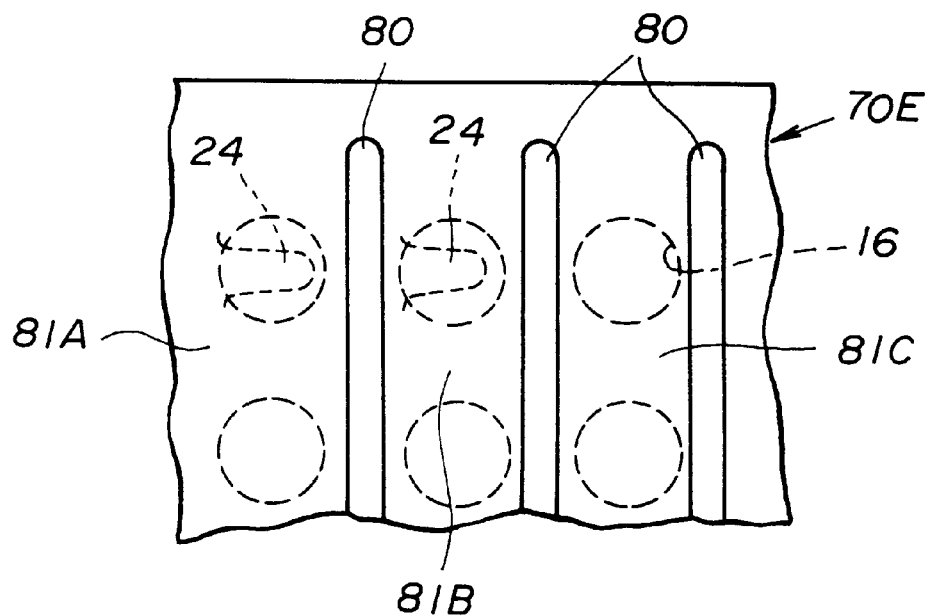

FIG. 22A shows a side sectional elevation view of part of a semiconductor testing device 10S in the eighteenth embodiment of the present invention. FIG. 22B shows a bottom view of part of the semiconductor testing device 10S. In FIGS. 22A and 22B, for the components/parts identical to those of the semiconductor testing devices 10A and 10N in the first and fourteenth embodiments, shown in FIGS. 1, 2 and 18, the same reference numerals are given and the descriptions thereof will be omitted.

In the semiconductor testing device 10S in the eighteenth embodiment, a plurality of long and narrow through holes or slots 80 are formed in a reinforcement member 70E. The holes or slots 80 are formed approximately parallel with each other as shown in FIG. 22B.

By forming the long and narrow through holes or slots 80 in the reinforcement member 70E, when the reinforcement member 70E is deformed as a result of the bumps 2 pressing the connection portions 24, the deformation is absorbed as a result of the long and narrow through holes or slots 80 being deformed. That is, when deformation occurs in portions 81A, 81B and 81C which are defined by the long and narrow holes or slots 80, the deformation of each portion does not interact with the adjacent portions. Thereby, electrical connection between the connection portions 24 and the bumps 2 can be positively ensured.

A nineteenth embodiment of the present invention will now be described.

Figure 23:
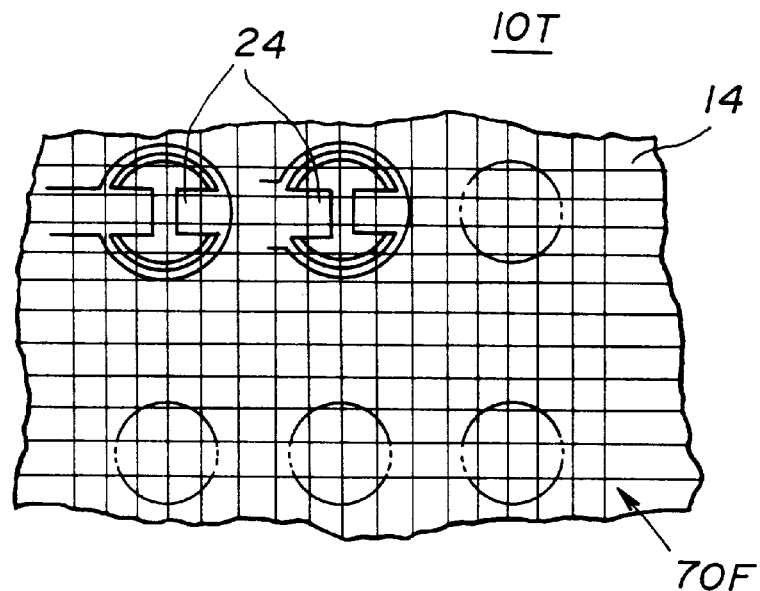
FIG. 23 illustrates a semiconductor testing device in a nineteenth embodiment of the present invention.

FIG. 23 shows a bottom view of part of a semiconductor testing device 10T in the nineteenth embodiment of the present invention. In FIG. 23, for the components/parts identical to those of the semiconductor testing devices 10A and 10N in the first and fourteenth embodiments, shown in FIGS. 1, 2 and 18, the same reference numerals are given and the descriptions thereof will be omitted.

In the semiconductor testing device 10T in the nineteenth embodiment, a net-shaped elastic member is used as a reinforcement member 70F. This net-shaped elastic member 70F is made from, for example, elastic wires (insulating wires) which are woven to have a net shape. Therefore, the reinforcement member 70F is flexibly deformed when a pressing force is applied thereto. This reinforcement member 70F is provided on the entire bottom surface of the insulating substrate 14 including the bottom surfaces of the connection portions 24.

In the nineteenth embodiment, by using the net-shaped elastic member as the reinforcement member 70F, in comparison to the arrangements of the fourteenth through eighteenth embodiments shown in FIGS. 18–22B, a space required for providing the reinforcement member 70F can be reduced. Thereby, the semiconductor testing device 10T can be miniaturized. Further, in comparison to the block-shaped reinforcement members 70A–70E, the cost can also be reduced.

A twentieth embodiment of the present invention will now be described.

Figure 24:
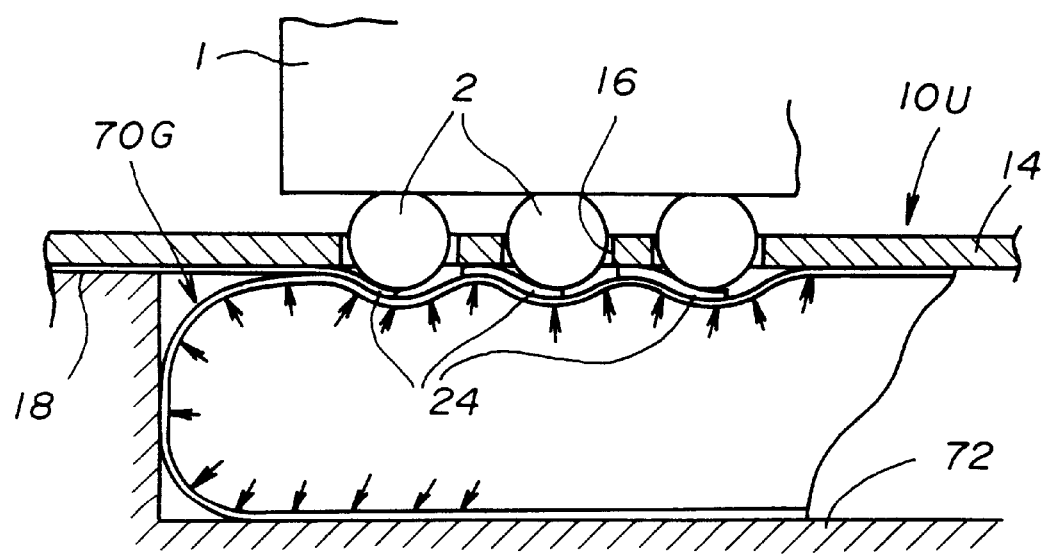
FIG. 24 illustrates a semiconductor testing device in a twentieth embodiment of the present invention.

FIG. 24 shows a side sectional elevation view of part of a semiconductor testing device 10U in the twentieth embodiment of the present invention. In FIG. 24, for the components/parts identical to those of the semiconductor testing devices 10A and 10N in the first and fourteenth embodiments, shown in FIGS. 1, 2 and 18, the same reference numerals are given and the descriptions thereof will be omitted.

In the twentieth embodiment, a balloon-shaped member which contains air or a liquid is used as a reinforcement member 70G. In this embodiment, the balloon-shaped member contains air. The balloon-shaped member 70G is connected to, for example, an air supply means such as an air pump. Air is supplied to the balloon-shaped reinforcement member 70G by the air supply means. This balloon-shaped reinforcement member 70G is provided in a depression formed in a holder 72. The insulating substrate 14 with the contact member 18 is placed on the balloon-shaped reinforcement member 70G, as shown in the figure.

In the above-described semiconductor testing device 10U, by adjusting the amount of air contained in the balloon-shaped reinforcement member 70G, the elastic force of the balloon-shaped reinforcement member 70G can be adjusted. Thereby, it is possible to set the elastic force of the balloon-shaped reinforcement member 70G to be appropriate for accommodating the variation of the heights of the bumps 2 and plastic deformation of the connection portions 24 can be prevented.

Further, by intentionally increasing and decreasing the internal pressure of the balloon-shaped reinforcement member 70G after the bumps 2 are connected to the connection portions 24, the connection portions 24 slide on the bumps 2, respectively. Thereby, even if oxide film and/or dust are present on the surfaces of the bumps 2 and the connection portions 24, the oxide film and/or dust are removed as a result of the wiping effect provided by the sliding movement. Thereby, it is possible to make the surfaces of the bumps 2 and the connection portions 24 be in a good condition.

A twenty-first embodiment of the present invention will now be described.

Figure 25:
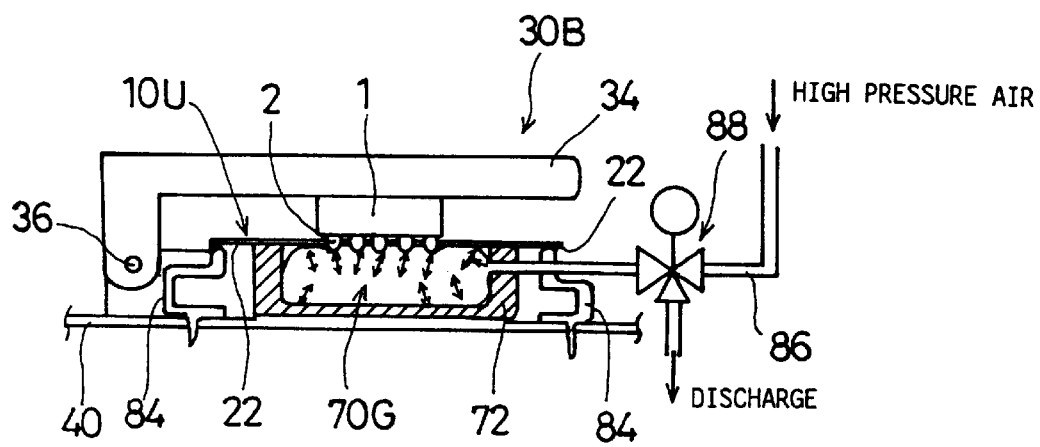
FIG. 25 illustrates a testing socket in a twenty-first embodiment of the present invention.

FIG. 25 shows the twenty-first embodiment. In this embodiment, the semiconductor testing device 10U in the twentieth embodiment shown in FIG. 24 is applied to a testing socket 30B. In FIG. 25, for the components/parts identical to those of the semiconductor testing devices 10A and 10U in the first and twentieth embodiments, shown in FIGS. 1, 2 and 24, the same reference numerals are given and the descriptions thereof will be omitted.

As shown in FIG. 25, the balloon-shaped reinforcement member 70G of the semiconductor testing device 10U is contained in the depression formed in the holder 72 which is a part of the testing socket 30B. The testing socket 30B includes a lid portion 34 which is rotatably supported by a base member, which is fixed on a testing board 40, through a shaft 36. The lid portion 34 can be locked in the closed position by a locking pin (not shown in the figure). FIG. 25 shows the closed position of the lid portion 34.

In this locked state, the lid portion 34 presses the semiconductor device 1 onto the semiconductor testing device 10U. Thereby, as described above, the bumps 2 formed on the semiconductor device 1 are connected with the connection portions 24 formed on the semiconductor testing device 10U. The semiconductor testing device 10U is connected with the testing board 40 through the terminal portions 22 and contacts 84. In this condition, a predetermined test can be performed on the semiconductor device 1 through the testing board 40.

A pipe 86, which is connected with a high-pressure air source, is connected with the balloon-shaped reinforcement member 70G. At a middle position of the pipe 86 between the high-pressure air source and the balloon-shaped reinforcement member 70G, a valve device 88 is provided. This valve device 88 is, for example, a three-way valve. The valve device can switch the mode thereof between a mode (hereinafter, referred to as a 'supply mode') in which high-pressure air is supplied to the balloon-shaped reinforcement member 70G and a mode (hereinafter, referred to as a 'discharge mode') in which air in the balloon-shaped reinforcement member 70G is discharged.

By appropriately switching the mode of the valve device 88 between the supply mode and the discharge mode as a result of controlling the valve device 88, it is possible to control the internal pressure of the balloon-shaped reinforcement member 70G to a desired pressure, and the above-mentioned wiping effect can be provided.

A twenty-second embodiment of the present invention will now be described.

Figure 26:
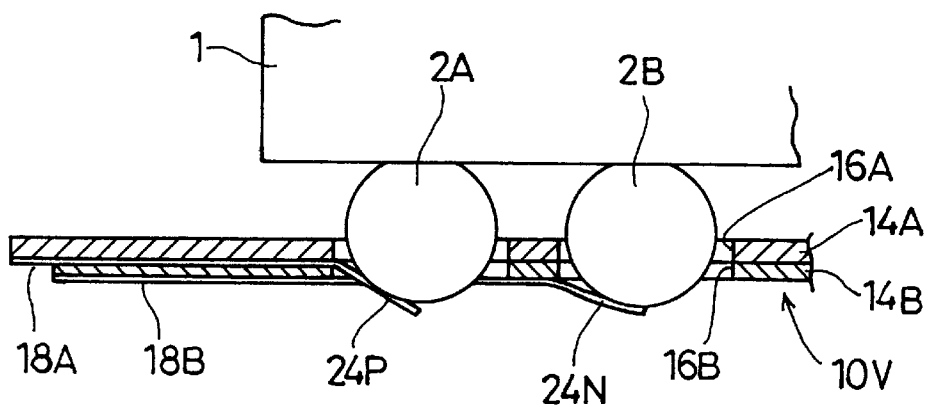
FIG. 26 illustrates a semiconductor testing device in a twenty-second embodiment of the present invention.

FIG. 26 shows a side sectional elevation view of part of a semiconductor testing device 10V in the twenty-second embodiment of the present invention. In FIG. 26, for the components/parts identical to those of the semiconductor testing device 10A in the first embodiment, shown in FIGS. 1 and 2, the same reference numerals are given and the descriptions thereof will be omitted.

In the semiconductor testing device 10V in the twenty-second embodiment, an insulating substrate 14A on which a contact member 18A is provided and an insulating substrate 14B on which a contact member 18B is provided are stacked with one another.

By using such a stacked-layer arrangement, a connection portion 24P of the contact member 18A is used for connecting with a bump 2A, a connection portion 24N of the contact member 18B is used for connecting with a bump 2B, and so forth. Thus, it is possible to reduce the number of bumps 2

(2A, 2B) which are connected with each layer (with the connection portions of each insulating substrate).

Thereby, variable wiring arrangements of the contact member 18A or 18B of each layer (on each insulating substrate 14A or 14B) can be provided. Accordingly, for the semiconductor device 1 which is of high density and has many bumps 2, an adequate semiconductor testing device 10V can be provided.

Figure 27A:
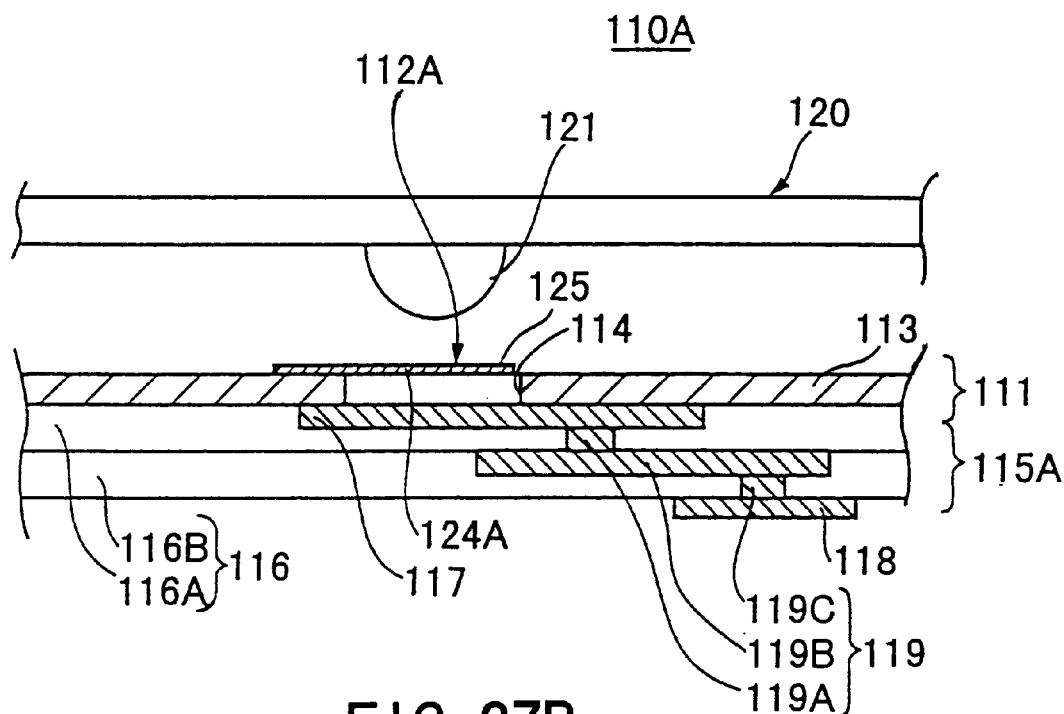
FIGS. 27A, 27B and 28 show elevational sectional views for illustrating a semiconductor testing device in a twenty-third embodiment of the present invention.
Figure 27B:
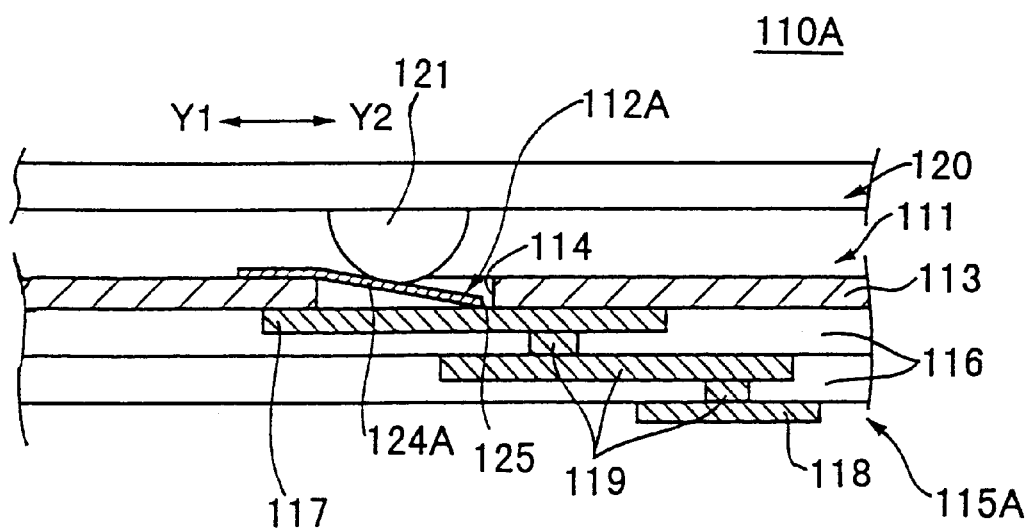
Figure 28:
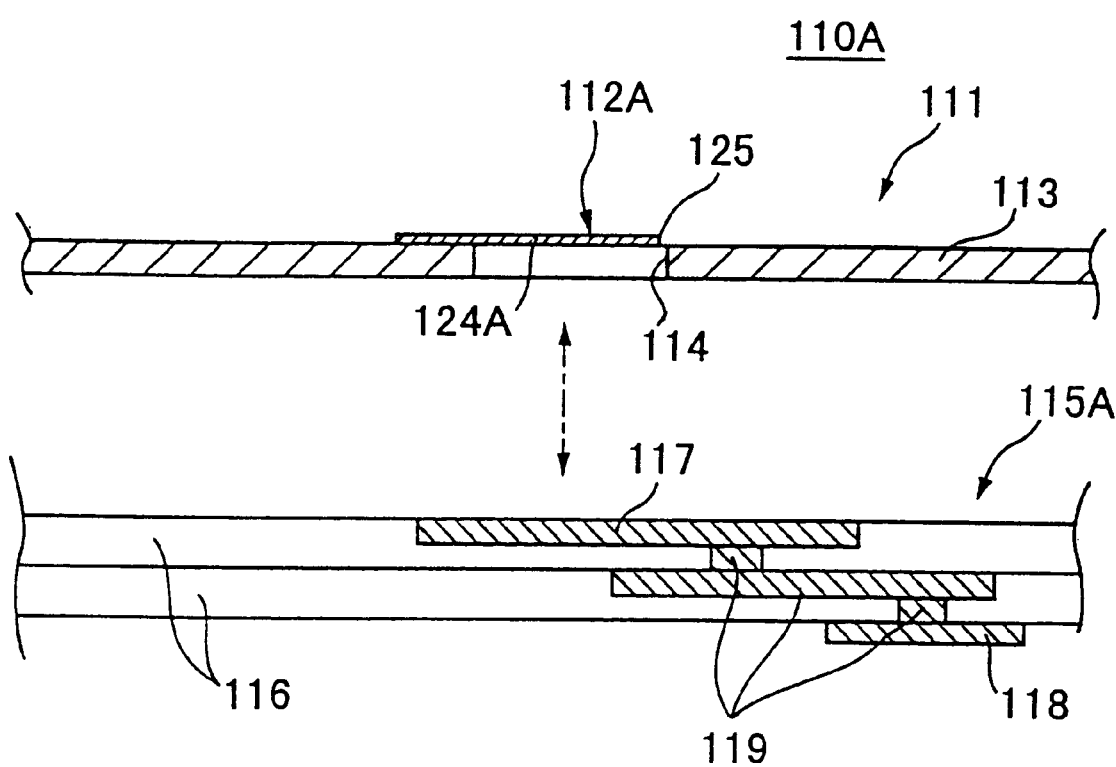

FIGS. 27A, 27B and 28 show a semiconductor testing device 110A in a twenty-third embodiment of the present invention. FIGS. 27A and 27B illustrate the arrangement and operation of the semiconductor testing device 110A. FIG. 28 shows a condition in which a contactor 111 is separate from a wiring substrate 115A.

As shown in the respective figures, in general, the semiconductor testing device 110A includes the contactor 111 and the wiring substrate 115A. A semiconductor device 120 is loaded on the semiconductor testing device 110A, a spherical connection terminal (referred to as a bump, hereinafter) 121 provided on the semiconductor device 120 is electrically connected with the semiconductor testing device 110A, and a predetermined test is performed on the semiconductor device 120 through the semiconductor testing device 110A.

In general, the contactor 111 includes a contact portion 112A, and an insulating substrate 113. The contact portion 112A is a tongue-shaped member, and, is formed of an elastically deformable conductive metal film such as a copper (Cu), an alloy of copper, or the like, for example. The contact portion 112A is provided at a position facing the bump 121 provided on the semiconductor device 120.

One end portion of the contact portion 112A is fixed to the insulating substrate 113, which will be described later, and the other end portion of the contact portion 112A extends on an opening 114 which is formed in the insulating substrate 113. Therefore, the contact portion 112A is supported and extends like a cantilever on the opening 114. Approximately the middle of the contact portion 112A is a connection portion 124A with which the bump 121 is connected.

The insulating substrate 113 is a single-layer, sheet-shaped resin substrate made of a resin, having the property of insulation, such as polyimide (PI) or the like, for example. The above-described contact portion 112A is formed on the top of the insulating substrate 113, and is supported by the insulating substrate 113. The opening 114 mentioned above is formed in the insulating substrate 113 at a position facing the contact portion 112. Forming of the contact portion 112A on the insulating substrate 113 can be performed easily at a low cost, because a technique of manufacturing a flexible substrate or the like can be used.

The insulating substrate may comprise a flexible film made of resin and having the property of insulation, and the contact portion may comprise a conductive metal layer having flexibility.

The wiring substrate 115A has a multilayer substrate arrangement, and includes a plurality (two, in the embodiment) of insulating layers 116A, 116B, and an internal connection terminal 117 (first connection terminal), an external connection terminal 118 (second connection terminal) and an interposer 119, which are formed in the insulating layers 116A, 116B, and so forth.

The insulating layers 116A, 116B are made of an insulating material such as glass epoxy or the like, for example. Further, the internal connection terminal 117, external connection terminal 118 and interposer 119 are formed through a plating technique, for example, in the insulating layers 116A, 116B. As the material of the internal connection terminal 117, external connection terminal 118 and interposer 119, a copper (Cu) is used.

The internal connection terminal 117 is formed on the surface (referred to as a top surface, hereinafter) of the wiring substrate 115A, on which surface the contactor 111 is loaded, at a position facing the contact portion 112A provided on the contactor 111. Accordingly, in the condition in which the contactor 111 is loaded on the wiring substrate 115A, the internal connection terminal 117 faces the contact portion 112A via the opening 114.

The external connection terminal 118 is formed on the surface (referred to as a bottom surface, hereinafter) opposite to the above-mentioned top surface of the wiring substrate 115A. The external connection terminal 118 is a terminal which is used for connecting the semiconductor testing device 110A with a semiconductor tester or the like which performs an operation test on the semiconductor device 120.

The interposer 119 is used for electrically connecting the internal connection terminal 117 with the external connection terminal 118. The interposer 119 includes a plurality of internal electric wires 119A, 119B and 119C. As a result of the internal connection terminal 117 and the external connection terminal 118 being connected with one another through the interposer 119, it is possible to improve flexibility in the position at which the internal connection terminal 117 is formed and the position at which the external connection terminal 118 is formed, such that these positions can be set arbitrarily.

The operation of the above-described semiconductor testing device 110A at a time of test will now be described. FIG. 27A shows a condition before the semiconductor device 120 is loaded on the semiconductor testing device 110A. In this embodiment, because the contact portion 112A has a cantilever-like arrangement, the contact portion 112A extends approximately straightly over the opening 114 before the semiconductor device 120 is loaded on the semiconductor testing device 110A. (Hereinafter, the condition shown in FIG. 27A will be referred to as a before-loaded condition.)

When the semiconductor device 120 is loaded on the semiconductor testing device 110A in the before-loaded condition, during the loading process, the bump 121 is inserted into the opening 114. As a result, the contact portion 112A, which is made of an elastic material and has a cantilever-like arrangement, is elastically deformed, as shown in FIG. 27B, and, thus, the extending end 125 of the contact portion 112A comes into contact with the internal connection terminal 117 of the wiring substrate 115A. Thereby, the bump 121 is electrically connected with the external connection terminal 118 via the contact portion 112A, internal connection terminal 117 and interposer 119.

A plurality of contact portions 112A, which are provided on the insulating substrate 113 for a plurality of bumps 121 of the semiconductor device 120, respectively, are formed independently. Therefore, when the bumps 121 are inserted into the insulating substrate 113, the respective contact portions 112A are lowered independently. As a result, even when there is variation in the heights of the bumps 121, the respective contact portions 112A are deformed in proportion to the individual heights of the bumps 121, respectively. Thereby, it is possible to cause the contact portion 112A to be stably connected with the internal connection terminal 117.

Thus, in this embodiment, the internal connection terminal 117, which is connected with the contact portion 112A, is electrically connected with the external connection terminal 118 via the interposer 119, which is provided in the wiring substrate 115A. As a result, by appropriately arranging the interposer 119, it is possible to arbitrarily set a wiring path for electrically connecting the internal connection terminal 117 with the external connection terminal 118.

Thus, as a result of the wiring path from the contact portion 112A to the external connection terminal 118 being formed not in the contactor 111 but in the wiring substrate 115A, it is not necessary to produce a multilayer contactor, and the single-layer contactor 111 can be used. Thus, it is possible to reduce the cost of the contactor 111.

Further, a glass epoxy substrate, which is generally used as a wiring substrate in electronic equipment, can be used as the wiring substrate 115A. Therefore, it is possible to reduce the cost of the wiring substrate 115A. As a result, it is possible to reduce the cost of the semiconductor testing device 110A.

Further, the contact portion 112A provided in the contactor 111 causes an electric signal from the semiconductor device 120 to directly flow to the wiring substrate 115A. Therefore, even when the pitch of the bumps 21 is reduced, it is not necessary to provide electric wires 108A between membrane terminals 106A-1 and 106A-2 (see FIG. 30). Accordingly, in the arrangement of this embodiment, it is possible to shorten the wire length between the internal connection terminal 117 and the external connection terminal 118, and to simplify the wiring arrangement, and, as a result, it is possible to use the semiconductor testing device 110A in a high-speed electrical test.

In the first embodiment, the wiring substrate comprises a multi-layer substrate. As a result, it is possible to achieve the contactor with a minute pitch of the contact portions, and, also, it is possible to provide the semiconductor testing device which can be used for a high-speed test.

Further, the semiconductor testing device 110A has an arrangement such as, as shown in FIG. 28, to permit installation and removal of the contactor 111 onto and from the wiring substrate 115A. Thereby, when the contact portion 112A is degraded as a result of the semiconductor testing device 110A being used repeatedly for testing many semiconductor devices 120, the contactor 111 is replaced with a new one. Thereby, it is possible to maintain reliability of the test performed on the semiconductor devices 120.

As a result of the cost of the contactor 111 being reduced, as mentioned above, when replacement of the contactor 111 is needed, it is possible to perform replacement at a low cost. Therefore, the cost required for the maintenance can be reduced.

Advantages of the twenty-third embodiment will now be described in detail.

Recently, a highly integrated and high-density semiconductor device having spherical connection terminals (bumps) has been produced. As a result, bump size and pitch of the semiconductor device have been a greatly reduced. Therefore, achievement of a high-accuracy contactor which can come into contact with an arrangement of minute terminals of the semiconductor device, and maintenance of stable electrical connection with the minute terminals have been very important objects.

Further, as the pitch of the terminals of the semiconductor is reduced, it is necessary to use a multilayer wiring. Thereby the cost of the minute-pitch contactor increases.

Generally speaking, a semiconductor testing device has a contactor which is used for electrical connection with a semiconductor device. The contactors provided in the semiconductor testing devices are classified into so-called pogo-pin type ones in which pins come into contact with terminals of the semiconductor device using spring forces, and membrane-type ones in which spherical-surface terminals which are to be connected with the spherical connection terminals (bumps) are formed on a thin insulation film through, for example, plating or the like.

Figure 29A:
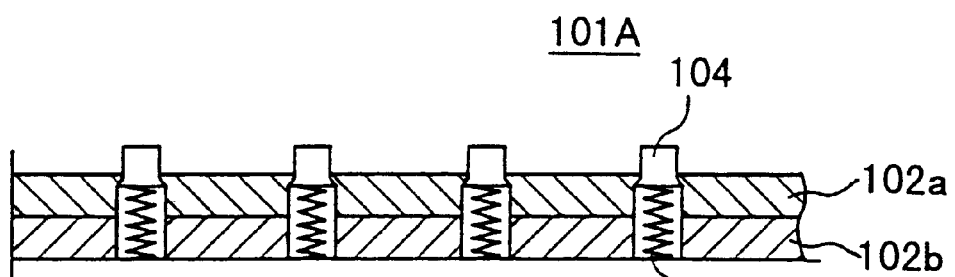
FIGS. 29A and 29B illustrate one example of a semiconductor testing device.
Figure 29B:
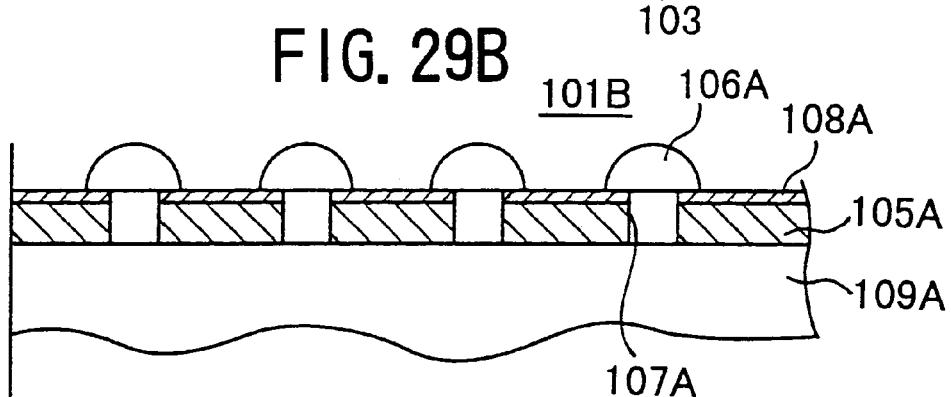

FIG. 29A shows a pogo-pin type semiconductor testing device 101A. In the semiconductor testing device 101A, coil springs 103 are provide through a pair of substrates 102a, 102b. By using the elastic forces of the coil springs 103, pogo pins 104 are lifted and lowered, and, thus, the pogo pins 104 come into contact with the bumps (not shown in the figure) provided on the semiconductor device.

However, because the coil springs 103 are used in the semiconductor testing device 101A, it is not possible to use the semiconductor testing device 101A for a high-density semiconductor device. In order to eliminate this problem, the membrane-type semiconductor testing device 101B has been developed.

The membrane-type semiconductor testing device 101B has a contactor in which spherical-surface terminals 106A (which is referred to as membrane terminals) are formed through plating. The membrane terminals 106A are connected with the bumps (not shown in the figure) of the semiconductor device, and a test of the semiconductor device is performed.

Further, on the top surface of an insulating substrate 105A, the electric wires 108A, which are connected with the membrane terminals 106A, respectively, are formed. The electric wires 108A connected with the membrane terminals 106A extend to peripheral positions of the insulating substrate 105A. Further, an elastic member 109A is provided below the contactor, and, even if variation in the heights of the bumps of the semiconductor device exists, positive electrical connection is achieved as a result of the elastic member 109A being elastically deformed appropriately.

However, in the membrane-type semiconductor testing device 101B, the electric wires 108A are laid on the top surface of the insulating substrate 105A. As a result, as the terminal pitch is reduced, it is not possible to provide a sufficient area in which the electric wires 108A are laid.

Figure 30:
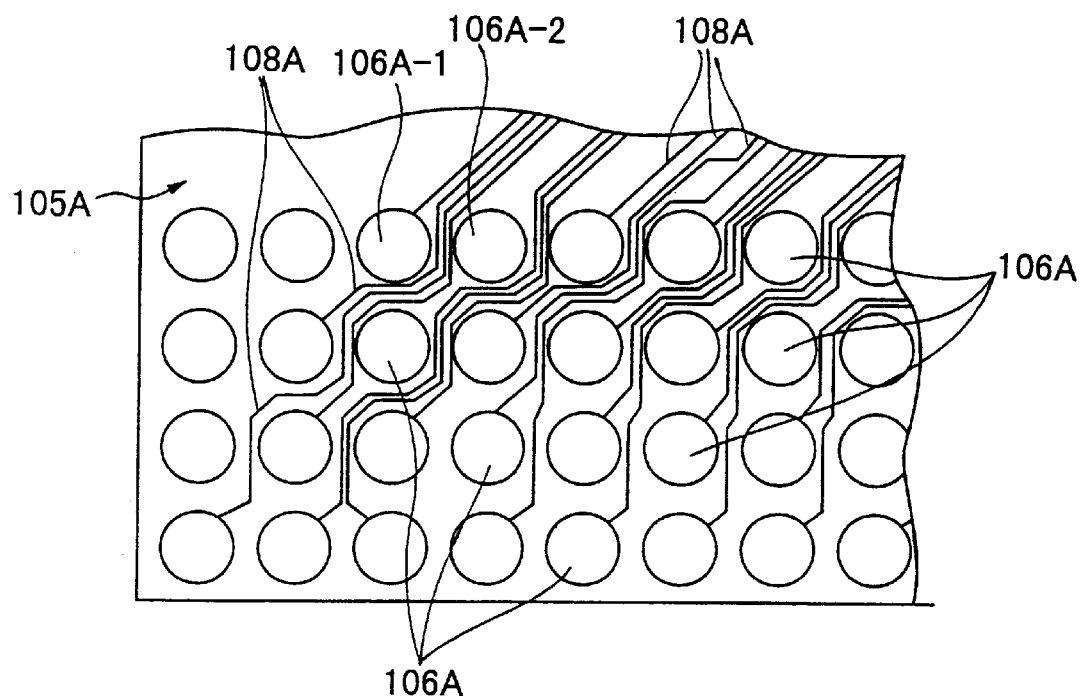
FIG. 30 illustrates another example of a semiconductor testing device.

That is, in the arrangement in which the electric wires 108A are laid only on the top surface of the insulating substrate 105A, when a high-density semiconductor testing device 101B is produced, the pitch between each pair of adjacent membrane terminals 106A is reduced, and, also, the number of electric wires 108A increases. Therefore, as shown in FIG. 30, it is necessary to provide many electric wires 108A between adjacent membrane terminals 106A. In the example shown in FIG. 30, three wires are provided between the membrane terminals 106A-1 and 106A-2. However, the number of electric wires 108A which can be provided between the pair of adjacent membrane terminals 106A-1, 106A-2, the pitch of which is reduced, is naturally limited.

Figure 31:
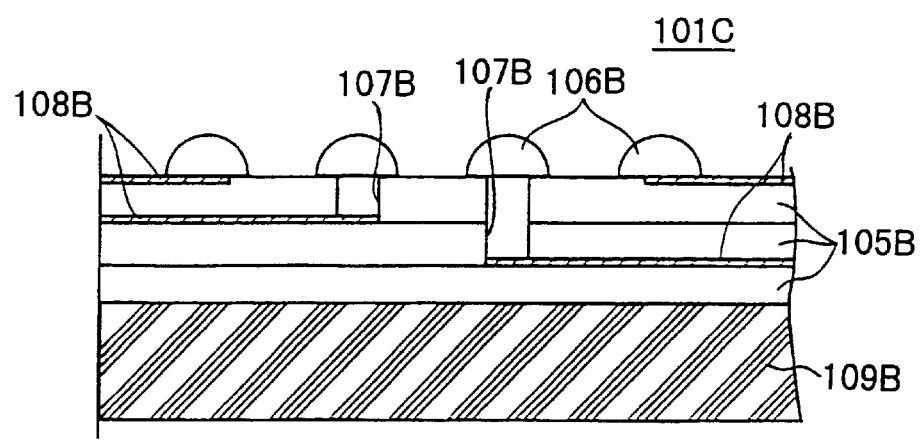
FIG. 31 illustrates another example of a semiconductor testing device.

Therefore, as in a semiconductor testing device 101C shown in FIG. 31, provision of a multilayer contactor can be considered. In the semiconductor testing device 101C shown in the figure, 3 layers of insulating substrates 105B are stacked. On each insulating substrate 105B, an electric wire 108B is formed. Further, below the contactor, an elastic member 109B is provided, and, even if variation in the heights of the bumps of the semiconductor device exists, positive electrical connection can be achieved as a result of the elastic member 109B being elastically deformed appropriately.

In this arrangement, the electric wire 108B is formed on each insulating substrate 105B. Therefore, flexibility in layout of the electric wires 108B is improved, and, therefore, it is possible to widen the pitch between adjacent electric wires 108B. Accordingly, when the pitch between adjacent membrane terminals 106B is reduced, it is possible to widen the space between adjacent electric wires 108B. As a result, the semiconductor testing device 101C can be used for a high-density semiconductor device.

However, manufacturing of the contactor as a result of the plurality of insulating substrates 105B and the membrane terminals 106B being stacked is technically very difficult, and development thereof is difficult. As a result, when such an arrangement is manufactured, the contactor is very expensive.

Further in the membrane-type semiconductor testing device 101C, generally, when the membrane terminals 106B are degraded (movement of solder, adhesion of foreign bodies, etc.), or damaged, due to connection with the bumps, the contactor is replaced. However, when the contactor is expensive as mentioned above, the cost required for testing a semiconductor device is very high.

In order to eliminate these problems, a method of providing a contactor of one layer or two layers, providing an anisotropic conductive rubber below the contactor, and connecting the anisotropic conductive rubber with the contactor can be considered. However, the anisotropic conductive rubber is very expensive, there is a limit to reduction of the pitch of a minute-pitch arrangement, and, also, durability thereof is not sufficient.

The twenty-third embodiment is directed to elimination of the above-described problems. In this embodiment, it is possible to provide a high-density, low-cost semiconductor testing device.

A twenty-fourth embodiment of the present invention will now be described.

Figure 32:
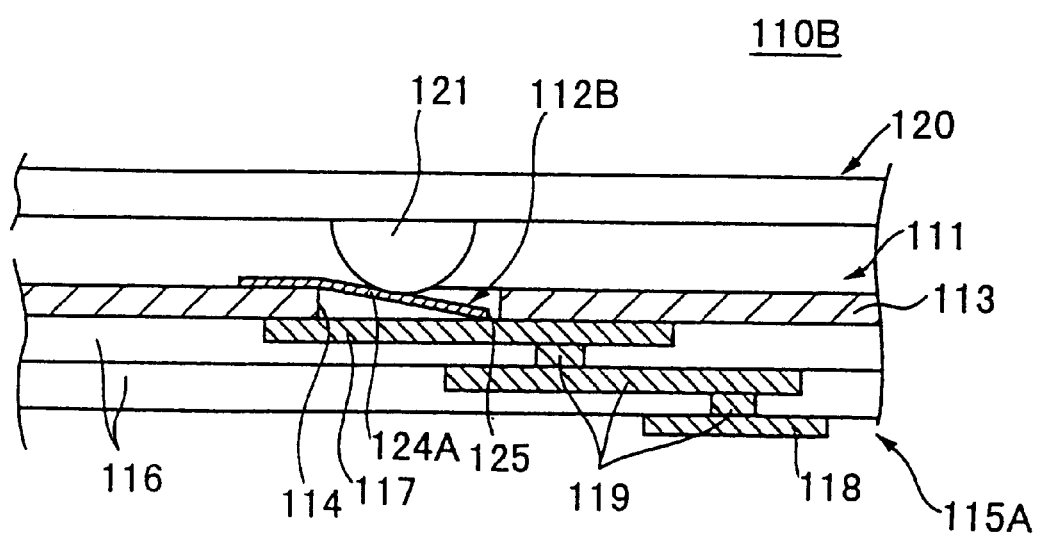
FIG. 32 shows an elevational sectional view for illustrating a semiconductor testing device in a twenty-fourth embodiment of the present invention.

FIG. 32 shows a semiconductor testing device 110B in the twenty-fourth embodiment of the present invention. In FIG. 32, the same reference numerals are given to parts/portions the same as those of the semiconductor testing device 110A in the twenty-third embodiment shown in FIGS. 27A, 27B and 28, and descriptions thereof are omitted. To respective embodiments (twenty-fifth through thirty-third embodiments), which will be described later, the same manner is applied.

In the semiconductor testing device 110B in this embodiment, a contact portion 112B has a thickness or a hardness such that, when the bump 121 is connected with the contact portion 112B, the contact portion 112B can break the oxide film formed on the surface of the bump 121.

As is well known, in a case where the bump 121 is made of solder, the oxide film is formed on the surface of the bump 121. Because the oxide film has the property of insulation, the electric connectability between the bump 121 and the contact portion 112B is degraded when the oxide film is left as it is.

As a result of the thickness or the hardness of the contact portion 112B being increased, as in this embodiment, the contact portion 112B is able to break the oxide film formed on the surface of the bump 121. More specifically, when the semiconductor device 120 is loaded on the contactor 111 and the bump 121 slides on the contact portion 112B along the surface of the contact portion 112B, the contact portion 112B wipes the bump 121, and can break the oxide film on the bump 121.

Thereby, it is possible to improve the electrical connectability between the contact portion 112B and the bump 121, and a stable contact condition can be maintained during the test. As a specific example of the contact portion 112B, in a case where a copper (Cu) is used as the material thereof, it is possible to break the oxide film as a result of the thickness of the contact portion 112B being on the order of 15 μm through 200 μm.

The twenty-fifth embodiment of the present invention will now be described.

Figure 33A:
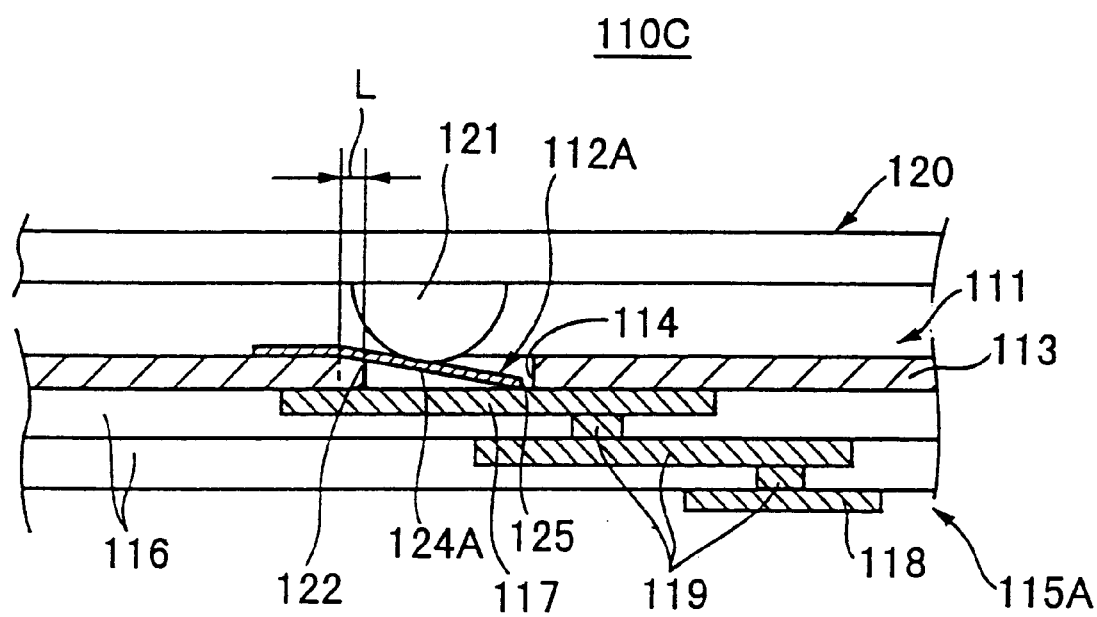
FIG. 33A shows an elevational sectional view for illustrating a semiconductor testing device in a twenty-fifth embodiment of the present invention.
Figure 33B:
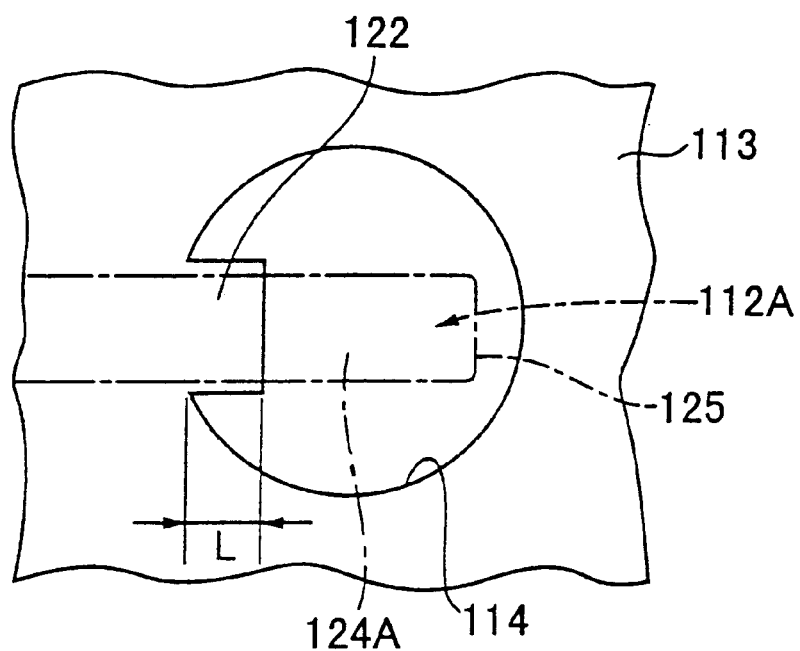
FIG. 33B shows a partially magnified plan view of an insulating substrate of the semiconductor testing device in the twenty-fifth embodiment of the present invention.

FIGS. 33A and 33B show a semiconductor testing device 110C in the twenty-fifth embodiment of the present invention. In the semiconductor testing device 110C, an extending portion 122 is formed in the opening 114. Specifically, as shown in FIG. 33B, the extending portion 122 extends inside of the opening 114 by a length indicated by L from the edge of the opening 114.

The extending portion 122 is formed integrally with the insulating substrate 113, at the position facing the contact portion 112A. The contact portion 112A is partially supported by the extending portion 122.

As a result of providing the extending portion 122 which partially supports the contact portion 112A, it is possible to adjust the reaction force which is developed in the contact portion 112A as a result of the contact portion 112A being pushed by the bump 121. The adjustment of the reaction force can be performed as a result of the length L of the extending portion 122 being adjusted. As the extending portion 122 is elongated, the contact portion 112A is not likely to bend, and the reaction force increases. Conversely, as the extending portion 122 is shortened, the reaction force decreases.

Thus, in this embodiment, the contact pressure developed between the contact portion 112A and the bump 121 when the semiconductor device 120 is loaded on the contactor 111 can be adjusted to an appropriate value. Thereby, it is possible that the contact portion 112A and the bumps are connected with one another in a good condition.

The twenty-sixth embodiment of the present invention will now be described.

Figure 34:
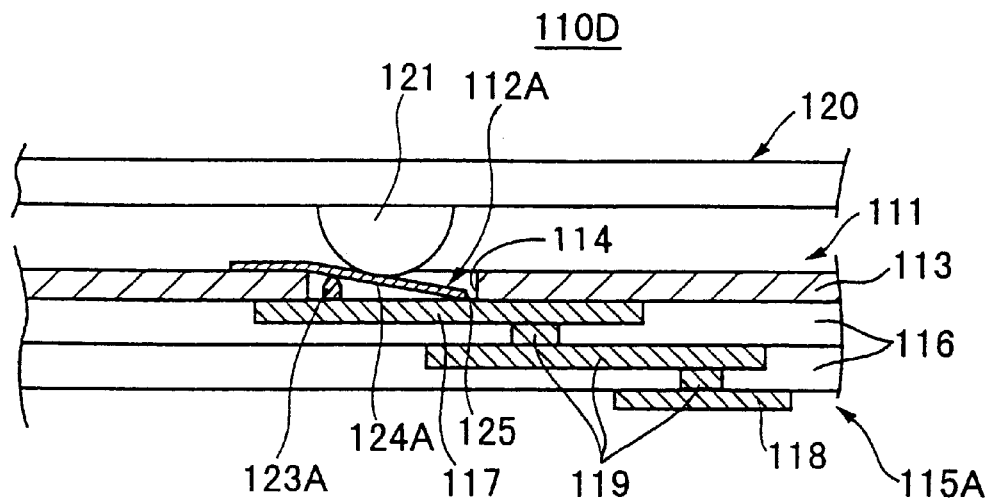
FIG. 34 shows an elevational sectional view for illustrating a semiconductor testing device in a twenty-sixth embodiment of the present invention.

FIG. 34 shows a semiconductor testing device 110D in the twenty-sixth embodiment of the present invention. In the semiconductor testing device 110D, a projection 123A, which comes into contact with the contact portion 112A, is formed in the opening 114.

As a result of the projection 123A being formed in the opening 114, when the contact portion 112A is bent and thus a first portion of the contact portion 112A is moved as a result of the first portion being pushed by the bump 121 at the time of connection, the contact portion 112A comes into contact with the projection 123A at a certain height (the height of the projection 123A), and a second portion of the contact portion 112A is further moved, which second portion is a portion extending from a position to the extending end 125 of the contact portion 112A, at which position the contact portion 112A is supported by the projection 123A. Accordingly, as a result of adjusting the height and the position of the projection 123A, it is possible to adjust the contact pressure which is applied to the bump 121 by the contact portion 112A. As a result, it is possible to achieve the contact pressure which is optimum for the electrical connection between the contact portion 112A and the bump 121. Thereby, it is possible that the contact portion 112A and the bump 121 are connected with one another in a good condition.

This projection 123A can be made of a conductive metal (for example, gold, palladium, nickel, or the like), resin (for example, polyimide, epoxy, or the like), or an elastic material (for example, a conductive rubber in which carbon or the like is mixed, a sponge, or the like).

When the projection 123A is made of a conductive material, electrical connection between the contact portion 112A and the internal connection terminal 117 can be performed not only through the extending end 125 of the contact portion 112A but also through the projection 123A. As a result, it is possible to positively perform the electrical connection between the contact portion 112A and the internal connection terminal 117.

When the projection 123A is made of an elastic material, as a result of the hardness of the projection 123A being adjusted, it is possible that an appropriate contact pressure is developed between the bump 121 and the contact portion 112A. Thereby, stable electrical connection can be achieved.

Further, in addition to the reaction force developed in the contact portion 112A when the bump 121 pushes the contact portion 112A, the elastic restoration force developed as a result of the projection 123A itself being elastically deformed is applied to the bump 121 as the reaction force. Therefore, in this embodiment, even in a case where a sufficient contact pressure cannot be obtained only by the reaction force developed in the contact portion 112A, the contact pressure required for an appropriate electrical connection can be positively developed by the projection 123A. As a result, it is possible to achieve stable electrical connection.

The adjustment of the contact pressure can be performed in the range of hardness $H_R$ C10 through 100 as a result of the hardness of the material and/or the height of the projection 123A being adjusted appropriately.

In the case where the projection 123A is made of metal, the projection 123A can be formed through plating, wire bonding, or the like, for example. In the case where the projection 123A is made of resin, the projection 123A can be formed through potting or the like, for example.

When the projection 123A is formed through plating, in a case where the contactor 111 is used for testing the semiconductor device 120 on which a pattern is formed with a narrow pitch and the bumps are provided in high density, respective projections 123A can be manufactured in high accuracy, in comparison to a case where respective projections 123A are formed through adhesion.

When the projection 123A is formed through wire bonding, because it is possible to use an existing wire bonder, it is possible to form the projection 123A at a low cost. Further, for a case where merely a small number of semiconductor testing devices are produced for each type, it is possible to perform production for the respective types flexibly.

Further, when the projection 123A is formed through potting, because the projection 123A can be formed through inexpensive equipment, it is possible to reduce the cost required for forming the projection 123A. Further, for a case where merely a small number of semiconductor testing devices are produced for each type, it is possible to perform production for the respective types flexibly.

The twenty-seventh and twenty-eighth embodiments of the present invention will now be described.

Figure 35:
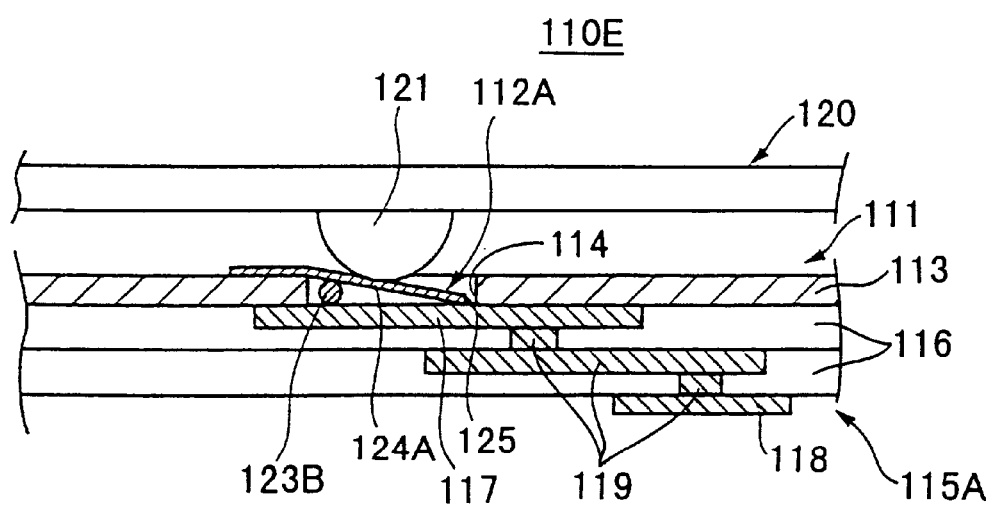
FIG. 35 shows an elevational sectional view for illustrating a semiconductor testing device in a twenty-seventh embodiment of the present invention.
Figure 36:
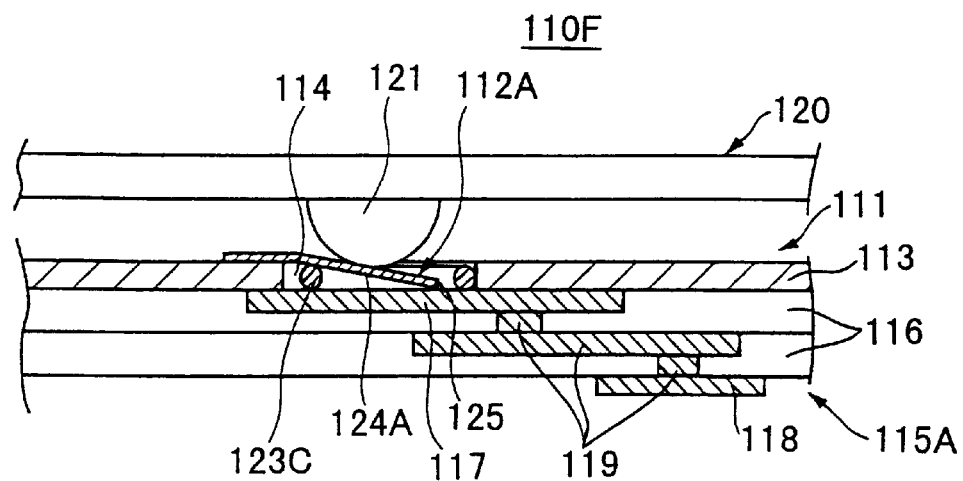
FIG. 36 shows an elevational sectional view for illustrating a semiconductor testing device in a twenty-eighth embodiment of the present invention.

FIG. 35 shows a semiconductor testing device 110E in the twenty-seventh embodiment of the present invention. FIG. 36 shows a semiconductor testing device 110F in the twenty-eighth embodiment of the present invention. In the semiconductor testing device 110E, a spherical projection 123B is used. In the semiconductor testing device 110F, a ring-shaped projection 123C (for example, an O ring) is used.

As a result of the spherical projection 123B or the ring-shaped projection 123C being used, it is possible to provide the projection 123B or 123C in the opening 114 easily. Each of the projections 123B and 123C has a function similar to that of the projection 123A in the twenty-sixth embodiment, and, also, materials and properties the same as those of the projection 123A can be applied to each of the projections 123B and 123C.

The shape of the contact portion will now be considered. In each of the twenty-third through twenty-eighth embodiments, the contact portion 112A or 112B has a simple tongue-like shape. However, the contact portion is used for the electrical connection with the internal connection terminal 117. Therefore, as a result of appropriately changing the shape of the contact portion, it is possible to improve the electrical connectability between the contact portion and the internal connection terminal 117. Variant examples of the shape of the contact portion will now be described.

Figure 37A:
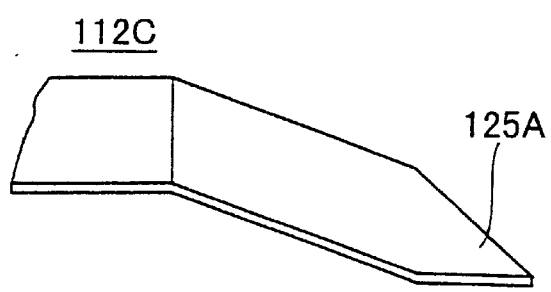
FIGS. 37A and 37B illustrate first and second variant examples of contact portions, respectively.
Figure 37B:
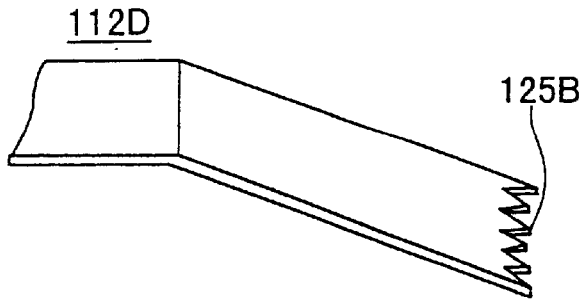

FIGS. 37A and 37B show contact portions 112C and 112D which are first and second variant examples, respectively. A pointed-end portion is formed at an extending-end portion of each of the contact portions 112C and 112D so that the electrical connectability with the internal connection terminal 117 is improved.

A point portion 125A as the pointed-end portion is formed at the extending-end portion of the contact portion 112C shown in FIG. 37A. As a result of the point portion 125A being formed at the extending-end portion of the contact portion 112C and thus being sharpened sharply, the point portion 125A sticks in or slides on the internal connection terminal 117, so that the oxide film formed on the surface of the internal connection terminal 117 can be broken. As a result, it is possible to perform stable electrical connection between the contact portion 112C and the internal connection terminal 117. The point portion 125A can be formed through etching or the like, for example.

A saw-tooth portion 125B is formed as the pointed-end portion at the extending-end portion of the contact portion 112D shown in FIG. 37B. As a result of the saw-tooth portion 125B being formed at the extending-end portion of the contact portion 125B and thus many point portions being provided there, it is possible that the oxide film formed on the surface of the internal connection terminal 117 is broken at a plurality of positions. Thereby, more stable electrical connection can be performed between the contact portion 112D and the internal connection terminal 117. This saw-tooth portion 125B can also be formed through etching or the like.

With reference to FIGS. 38A through 48, contact portions 112E through 112P, which are third through thirteenth variant examples, respectively, will now be described. FIGS. 38A, 39A, 40A, 41A, 42A, 43A, 44A, 45A, 46A and 47A show side elevational sectional views of the contact portions 112E through 112N, respectively, and FIGS. 38B, 39B, 40B, 41B, 42B, 43B, 44B, 45B, 46B and 47B show bottom views of essential portions of the contact portions 112E through 112N, respectively.

Figure 38A:
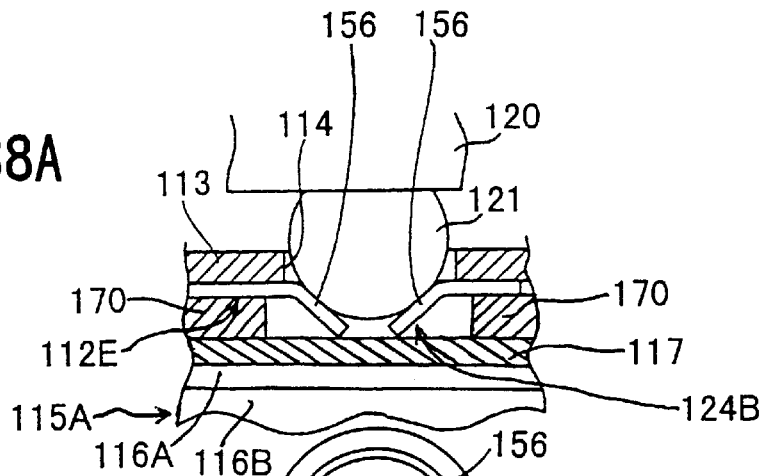
FIGS. 38A and 38B illustrate a third variant example of a contact portion.

When the contactor provided with each of the third through twelfth variant examples of the contact portions is provided on the wiring substrate 115A, as shown in FIG. 38A, spacers 170 are provided between the contactor provided with the contact portion and the wiring substrate 115A provided with the internal connection terminal 117. When the bump 121 is inserted into the opening 114, the connection portion of the contact portion is deformed and comes into contact with the internal connection terminal 117, as shown in the figure. For the sake of simplification, the spacers 170, internal connection terminal 117 and the insulating layers 116A, 116B will be omitted in FIGS. 39A, 40A, 41A, 42A, 43A, 44A, 45A, 46A and 47A.

Figure 38B:
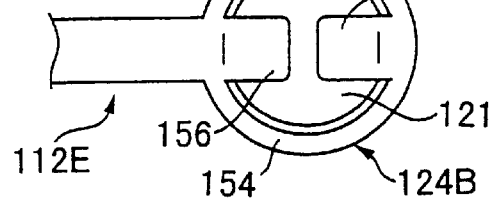

FIGS. 38A and 38B show the contact portion 112E which is the third variant example. In this variant example, the contact portion 112E includes a pair of cantilever portions 156. Specifically, a ring portion 154 is formed at a connection portion 124B of the contact portion 112E, and, as shown in FIG. 38B, the pair of cantilever portions 156 extend from opposite positions of the ring portion 154 toward the center of the ring portion 154.

In this variant example, at a time of testing, the cantilever portions 156 come into contact with the bump 121 at both sides thereof. Thereby, it is possible that the bump 121 is held stably. Therefore, it is possible to increase the strength of the connection portion 124B, and it is possible to prevent the connection portion 124B from being deformed plastically.

Figure 39A:
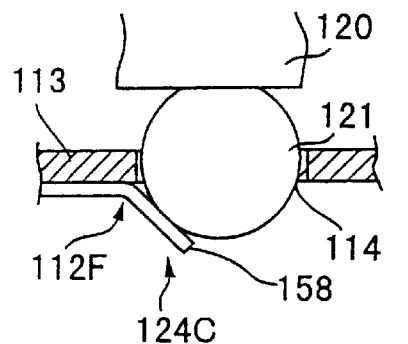
FIGS. 39A and 39B illustrate a fourth variant example of a contact portion.
Figure 39B:
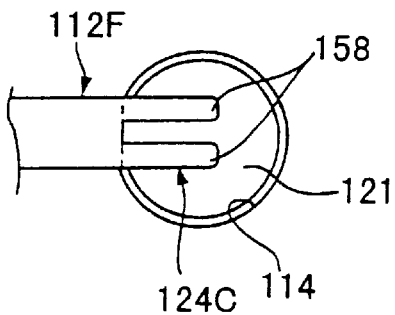

FIGS. 39A and 39B show the contact portion 112F which is the fourth variant example. In this variant example, a connection portion 124C is a forked cantilever portion 158. In this variant example, the connection portion 124C is likely to be deformed. As a result, even if variation in the height of the bump 121 exists, positive electrical connection is achieved as a result of the connection portion 124C being deformed appropriately.

However, because the connection portion 124C is likely to be deformed, in a case where the contact portion 112F is made of copper (Cu), plastic deformation of the connection portion 124C is likely to occur. Accordingly, in this variant example, it is preferable that the contact portion 112F be made of a material which has elasticity and also high electric conductivity.

FIGS. 40A and 40B show the contact portion 112G which is the fifth variant example. Each of the above-described contact portions 112A through 112F has a cantilever shape. In contrast to this, the contract portion 112G of this variant example includes a portion 160 supported at both ends thereof.

Specifically, a connection portion 124D has the portion 160 supported at both ends thereof, and each of both ends of the portion 160 is integrally connected with a ring portion 154. As a result of the connection portion 124D having the portion 160 supported at both ends thereof, the mechanical strength of the connection portion 124D can be increased. Thereby, the connection portion 124D can be prevented from being degraded due to long-term use.

FIGS. 41A and 41B show the contact portion 112H which is the sixth variant example. In the contact portion 112H of this variant example, an opening (slit) 163 is formed at the center line of the connection portion 124E. Thus, a pair of portions 162, each supported at both ends thereof, are formed. By forming the pair of portions 162 in the connection portion 124E, the amount of deformation of the portions 162 can be increased. Thereby, variation in the height of the bump 121 can be effectively accommodated.

Further, by providing the opening 163 between the portions 162, a bottom-end portion of the bump 121 is located in the opening 163 in the loaded condition. Thereby, movement of the bump 121 on the connection portion 124E can be prevented. Accordingly, the bump 121 (semiconductor device 120) can be positively positioned on the contact portion 112H (contactor 111).

In the sixth variant example, a bottom portion of the bump is inserted into the opening 163 f when the bump is connected with the contact portion. Thereby, it is possible to control occurrence of deformation of the bottom portion of the bump. Further, because the contact area between the bump and the contact portion increases, it is possible to achieve positive electrical connection between the bump and the contact portion.

Figure 42A:
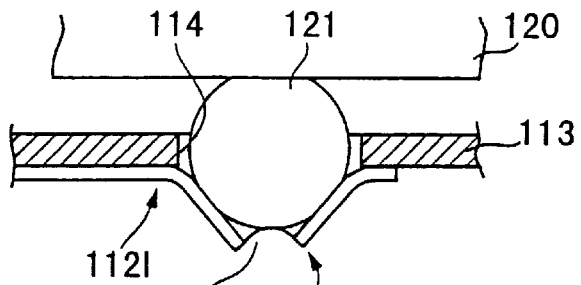
FIGS. 42A and 42B illustrate a seventh variant example of a contact portion.
Figure 42B:
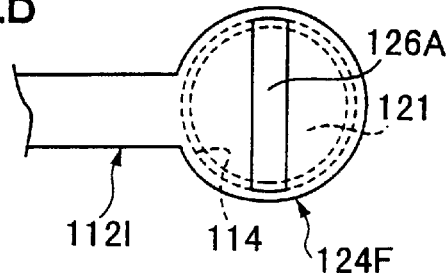

FIGS. 42A and 42B show the contact portion 112I which is the seventh variant example. In the contact portion 112I of the seventh variant example, a straight-line slit 126A is formed in a connection portion 124F so that the connection portion 124F is deformable.

The possible amount of deformation of the connection portion 124F of this variant example is less than the possible amount of deformation of the connection portion 124E of the sixth variant example. However, the mechanical strength of the connection portion 124F is higher than that of the connection portion 124E. Accordingly, in accordance with the material of the bump 121 (for example, whether the bump 2 is made of solder or gold, and so forth), an appropriate one of the connection portions 124E and 124F may be selected.

In the seventh variant example, a bottom portion of the bump is inserted into the slit 126A when the bump is connected with the contact portion. Thereby, it is possible to control occurrence of deformation of the bottom portion of the bump. Further, because the contact area between the bump and the contact portion increases, it is possible to achieve positive electrical connection between the bump and the contact portion.

Figure 43A:
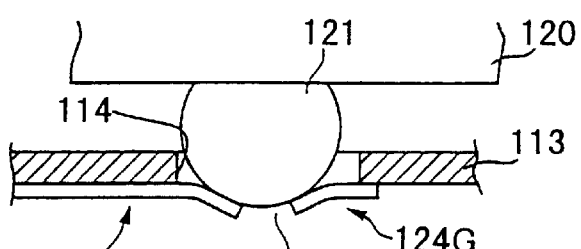
FIGS. 43A and 43B illustrate an eighth variant example of a contact portion.
Figure 43B:
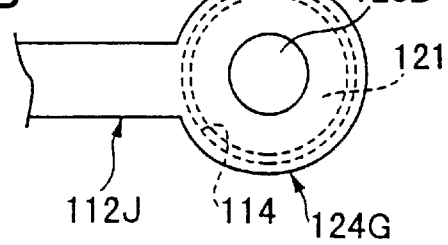

FIGS. 43A and 43B show the contact portion 112J which is the eighth variant example. In this variant example, a circular opening 126B is formed at the center of a connection portion 124G. The possible amount of deformation of the connection portion 124G is less than that of the connection portion 124F in the seventh variant example, while the mechanical strength of the connection portion 124G is higher than the connection portion 124F. Accordingly, as mentioned above, an appropriate one of the connection portions 124E, 124F and 124G may be selected. Further, because the opening 126B is located at the center of the connection portion 124G and also has the circular shape, the bump 121 is always located at the center of the connection portion 124G. Accordingly, the bump 121 (semiconductor device 120) can be positively positioned on the contact portion 112J (contactor 111).

In the eighth variant example, a bottom portion of the bump is inserted into the opening 126B when the bump is connected with the contact portion. Thereby, it is possible to control occurrence of deformation of the bottom portion of the bump. Further, because the contact area between the bump and the contact portion increases, it is possible to achieve positive electrical connection between the bump and the contact portion.

FIGS. 44A and 44B show the contact portion 112K which is the ninth variant example. In this variant example, many small-diameter circular openings 126C are formed in a connection portion 124H. By forming the large number of circular openings 126C in the connection portion 124H, similar to the above-described variant examples, the connection portion 124H is deformable. The possible amount of deformation can be adjusted by appropriately selecting the number of the circular openings 126C and the diameter of each circular opening 126C.

Further, by forming the large number of circular openings 126C, when the bump 121 is pressed onto the connection portion 124H, the edges of many of the circular openings 26D come into contact with and cut into the bump 2. Thereby, the electrical connectability between the connection portion 124H and the bump 121 can be improved.

FIGS. 45A and 45B show the contact portion 112L which is the tenth variant example. In the above-described respective variant examples, the connection portions 124B through 124H are integrally formed in the contact portions 112E through 112K, respectively. In contrast to this, in this variant example, a connection portion 124I is a member different from the contact portion 112L.

By using the connection portion 124I which is the member different from the contact portion 112L, it is possible to separately select the material of the contact portion 112L and the material of the connection portion 124I. Accordingly, it is possible to select a material that is optimum for the function of the contact portion 112L and to select a material that is optimum for the function of the connection portion 124I. In the contact portion 112L shown in FIGS. 45A and 45B, in order to set the possible amount of deformation of the connection portion 124I to be large, the connection portion 124I is a foil-like terminal 164. In this variant example, the foil-like terminal 164 is made of aluminum (Al), and the contact portion 112L is made of copper (Cu).

Figure 46A:
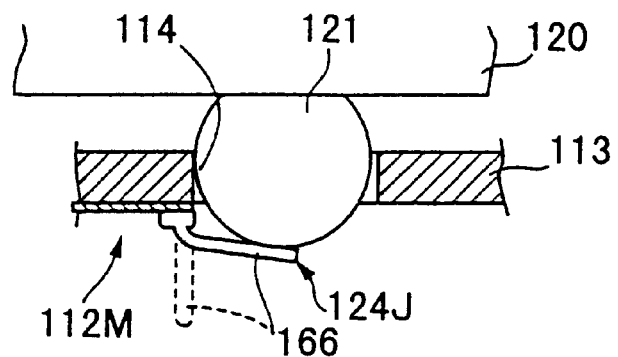
FIGS. 46A and 46B illustrate an eleventh variant example of a contact portion.
Figure 46B:
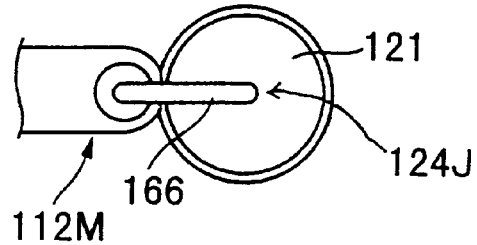

FIGS. 46A and 46B show the contact portion 112M which is the eleventh variant example. In this variant example, similar to the above-described tenth variant example, a connection portion 124J is a member different from the contact portion 112M. In this variant example, as shown in the figures, the connection portion 124J is a cantilever-shaped wire 166.

The cantilever-shaped wire 166 is formed using the wire-bonding technique. Specifically, wire bonding is performed at a position on the contact portion 112M in close proximity to the opening 114 using a wire-bonding apparatus. Then, after a predetermined length of wire is pulled out, the wire is cut. As a result, the wire is in a condition indicated by the broken line in FIG. 46A.

Then, the wire is bent to a position below the opening 114. Thus, the cantilever-shaped wire 166 is formed (indicated by the solid line in FIG. 46A). By forming the connection portion 124J using the wire-bonding technique, the connection portion 124J is easily and efficiently formed, and also, the cost therefor can be reduced. In this variant example, the connection portion 124J is the cantilever-shaped wire 166, one end of the wire 166 being fixed and the other end of the wire 166 being free. Thereby, the possible amount of deformation of the cantilever-shaped wire 166 is relatively large. As a result, even if the variation of the height of the bump 121 is large, the variation can be accommodated.

Figure 47A:
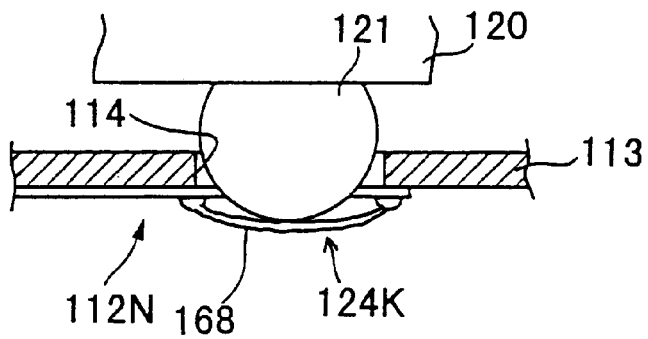
FIGS. 47A and 47B illustrate a twelfth variant example of a contact portion.
Figure 47B:
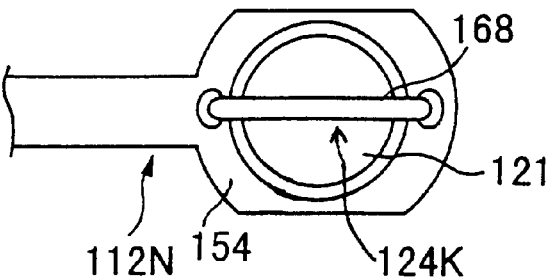

FIGS. 47A and 47B show the contact portion 112N which is the twelfth variant example. In this variant example, similar to the above-described eleventh variant example, the connection portion 124K is a wire 168. Although the connection portion 124J is the cantilever-shaped wire 166 in the eleventh variant example, the connection portion 124K is the wire 168 supported at both ends thereof in the twelfth variant example.

The wire 166 supported at both ends thereof is formed also using the wire-bonding technique. Specifically, first bonding is performed at a position on a frame portion 154 of the contact portion 112N in close proximity to the opening 114. Then, after the wire is pulled out a predetermined length, second bonding is performed at a position on the frame portion 154 opposite to the position of the first bonding. Thereby, each of the both ends of the wire 168 is fixed to the frame portion 154. By this arrangement, the mechanical strength of the connection portion 124K in the twelfth variant example is higher than that of the connection portion 124J in the eleventh variant example.

Although the single wire 168 supported at both ends thereof is used in this variant example, two wires 168, each supported at both ends thereof, may be used. The two wires 168 are arranged so as to cross to form a cross shape. In this arrangement, the effect provided by the twelfth variant example can also be provided, and, also, movement of the bump 121 can be prevented. Accordingly, the bump 121 (semiconductor device 120) can be positively positioned on the contact portion (contactor 111).

Figure 48:
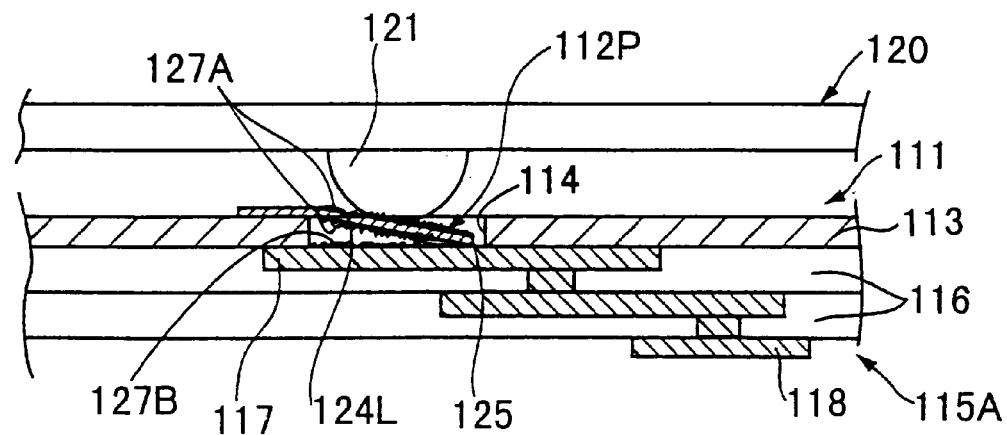
FIG. 48 illustrates a thirteenth variant example of a contact portion.

FIG. 48 shows the contact portion 112P which is the thirteenth variant example. In this variant example, roughened surfaces 127A are formed on the top surface (the surface with which the bump 121 comes into contact) and the portion (the bottom surface) which comes into contact with the internal connection terminal 117, respectively, of the contact portion 112P. Further, a roughened surface 127B is formed on the top surface of the internal connection terminal 117. The roughened surfaces 127A, 127B may be formed as a result of forming minute projections by changing a plating condition; as a result of roughening these surfaces by striking small particles against these surfaces through blast; as result of stamping on these surfaces using a member having a roughened surface, or the like.

In this variant example, in the case where the roughened surface 127A is formed on the top surface of the contact portion 112P, the oxide film formed on the surface of the bump 121 is broken by the roughened surface 127A when the bump 121 is connected with the contact portion 112P. Thereby, stable electrical connection can be provided between the contact portion 112P and the bump 121.

In the case where the roughened surface 127A is formed on the portion (the bottom surface) which comes into contact with the internal connection terminal 117, the oxide film formed on the surface of the internal connection terminal 117 is broken by the roughened surface 127A when the contact portion 112P comes into contact with the internal connection terminal 117. Thereby, stable electrical connection can be provided between the contact portion 112P and the internal connection terminal 117.

Further, as a result of the roughened surface 127B being formed on the internal connection terminal 117, even if the oxide film is formed on the contact portion 112P, this oxide film can be broken by the roughened surface 127B when the contact portion 112P comes into contact with the internal connection terminal 117. Thereby, stable electrical connection can be provided between the contact portion 112P and the internal connection terminal 117.

When each of the roughened surfaces 127A, 127B has the average roughness of 0.1 through 100 µm, the effects provided by the roughened surfaces are large.

Further, in the thirteenth variant example shown in FIG. 48, the roughened surface 127A is formed on each of both top and bottom surfaces of the contact portion 112P. However, it is also possible that the roughened surface 127A is formed on only one of the top and bottom surfaces of the contact portion 112P. Further, although the roughened surface 127B is formed on the entire surface of the internal connection terminal 117 in the thirteenth variant example, it is also possible that the roughened surface 127b is formed only on the area with which the contact portion 112P is connected.

The twenty-ninth and thirtieth embodiments of the present invention will now be described.

Figure 49:
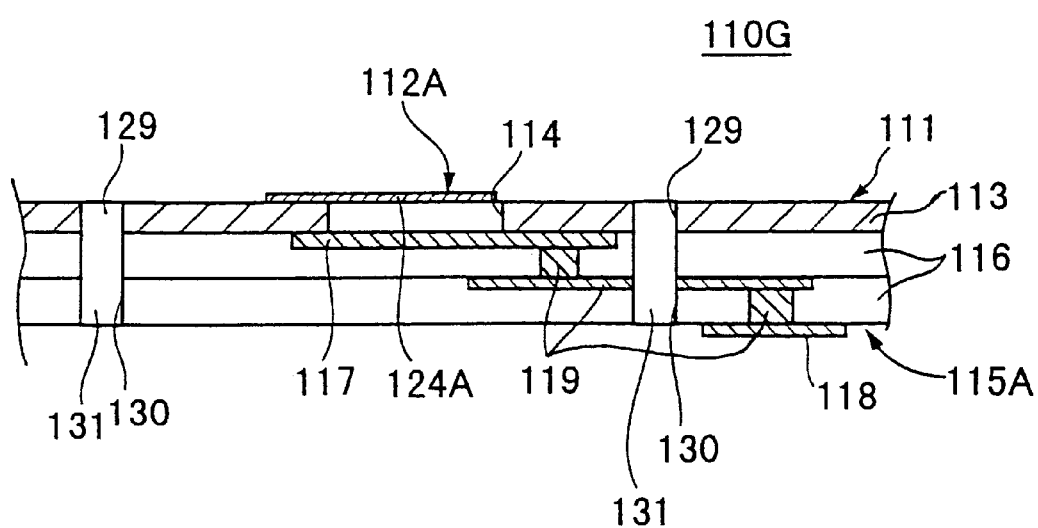
FIG. 49 shows an elevational sectional view for illustrating a semiconductor testing device in a twenty-ninth embodiment of the present invention.
Figure 50:
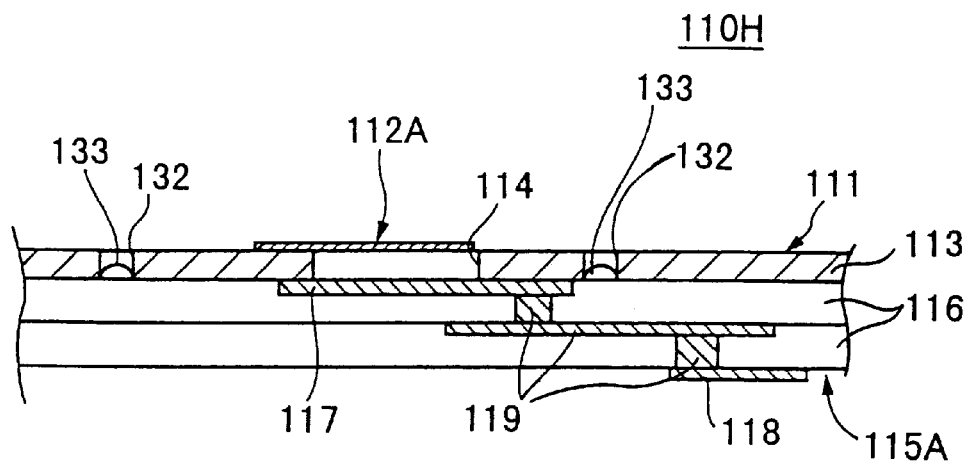
FIG. 50 shows an elevational sectional view for illustrating a semiconductor testing device in a thirtieth embodiment of the present invention.

FIG. 49 shows a semiconductor testing device 110G in the twenty-ninth embodiment of the present invention. FIG. 50 shows a semiconductor testing device 110H in the thirtieth embodiment of the present invention. In each of these embodiments, a positioning arrangement, for positioning of the contactor 111 with respect to the wiring substrate 115A when the contactor 111 is loaded on the wiring substrate 115A, is provided.

As described above with reference to FIG. 28, the semiconductor testing device has an arrangement such as to permit installation and removal of the contactor 111 onto and from the wiring substrate 115A. Thereby, when the contact portion is degraded as a result of the semiconductor testing device being used repeatedly for testing many semiconductor devices 120, the contactor 111 is replaced with a new one. Thereby, it is possible to always perform stable testing. When the contactor 111 is replaced with a new one, it is necessary to accurately position the contact portion with respect to the internal connection terminal 117. Therefore, it is necessary to accurately load the contactor 111 on the wiring substrate 115A. For this purpose, in each of the semiconductor testing devices 110G, 110H in the twenty-ninth and thirtieth embodiments, the positioning arrangement for positioning the contactor 111 with respect to the wiring substrate 115A is provided.

In the semiconductor testing device 110G shown in FIG. 49, the positioning arrangement includes first positioning holes 129 formed in the insulating substrate 113 of the contactor 111, second positioning holes 130 formed in the wiring substrate 115A, and positioning pins 131 which engage with the respective positioning holes 129, 130. Positioning of the contactor 111 (contact portion 112A) with respect to the wiring substrate 115A (internal connection terminal 117) is performed as a result of each of the positioning pins 131 being inserted into, so as to be fitted into, the respective one of positioning holes 129 and the respective one of the positioning holes 130 simultaneously so that the positioning pins 131 engage with the positioning holes 129, 130.

In the semiconductor device 110H shown in FIG. 50, the positioning arrangement includes positioning holes 132 formed in the insulating substrate 113 and positioning projections 133 formed on the top surface of the wiring substrate 115A. Positioning of the contactor 111 (contact portion 112A) with respect to the wiring substrate 115A (internal connection terminal 117) is performed as a result of the positioning projections 133 being inserted into, so as to be caused to engage with, the positioning holes 132, respectively.

In each of the semiconductor testing devices 110G and 110H in the respective embodiments, merely through a process of causing the positioning pins 131 to engage with the positioning holes 129, 130, or merely through a process of causing the positioning projections 133 to engage with the positioning holes 132, it is possible to position the contactor 111 with respect to the wiring substrate 115A. Therefore, through the simple arrangement and simple operation, positioning of the contact portion 112A with respect to the internal connection terminal 117 can be positively performed.

Thus, positioning of the opening and the contact portion provided in the contactor with respect to the internal connection terminal provided on the wiring substrate can be easily and positively performed.

Each of these positioning holes 129, 130, 132 may be formed through drilling, punching, or etching, or using a laser. Further, if it is necessary to perform positioning more accurately than the above-described positioning methods, it is possible that a positioning arrangement includes a camera, an image recognizing unit, and so forth, so that positioning is performed through image recognition.

The thirty-first embodiment of the present invention will now be described.

Figure 51:
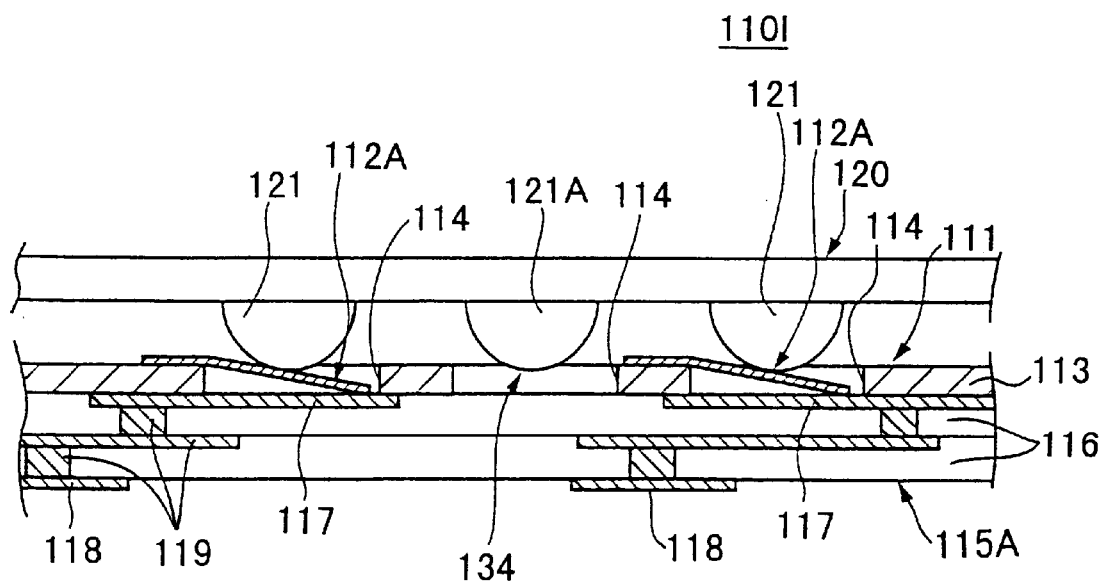
FIG. 51 shows an elevational sectional view for illustrating a semiconductor testing device in a thirty-first embodiment of the present invention.

FIG. 51 shows a semiconductor testing device 110I in the thirty-first embodiment of the present invention. In this embodiment, only the opening 114 is provided at a position at which no electrical connection between the contactor 111 and the bump 121 is necessary, that is, a non-connection portion 134 having no contact portion 112A is provided.

The semiconductor device 120 loaded on the semiconductor testing device 110I has many bumps 121. However, as is well known, when a test is performed on this semiconductor device 120, all the bumps 121 are not necessarily used for causing test signals to flow therethrough. (Hereinafter, the bumps, which are not used for causing test signals to flow therethrough, will be referred to as connection-unnecessary bumps 121A.)

In this embodiment, the non-connection portion 134, for which no contact portion 112A is provided, is provided at the position facing the connection-unnecessary bump 121A. Thereby, the connection-unnecessary bump 121A do not come into contact with a contact portion 112A. As a result of the non-connection portion 134 being provided, the connection-unnecessary bump 121A is merely located in the opening 114 and does not come into contact with the contactor 111 when the semiconductor device 120 is loaded on the semiconductor testing device 110I.

Therefore, the connection-unnecessary bump 121A can be prevented from being deformed in the non-connection portion 134. Further, the reaction force developed in the contact portion 112A does not exist in the non-connection portion 134. Therefore, the pushing force to be applied to the semiconductor device 120, by which force the semiconductor device 120 is pushed to the semiconductor testing device 110I when the semiconductor device 120 is loaded on the semiconductor testing device 110I, can be reduced. As a result, the loading work is easier.

The thirty-second embodiment of the present invention will now be described.

Figure 52:
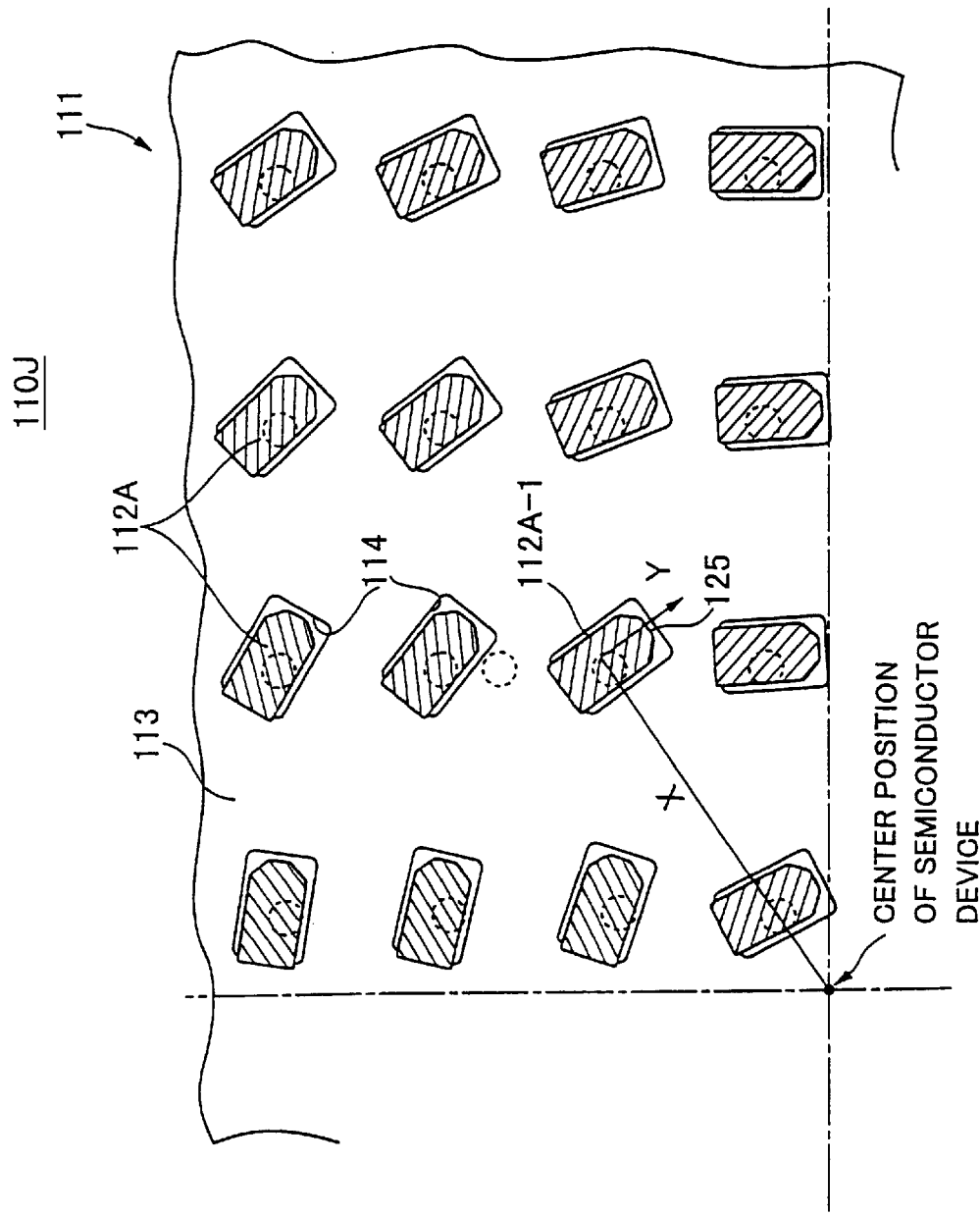
FIG. 52 shows a plan view for illustrating a semiconductor testing device in a thirty-second embodiment of the present invention.

FIG. 52 shows a partial plan view of the semiconductor testing device 110J in the thirty-second embodiment of the present invention. As shown in the figure, in the semiconductor testing device 110J in this embodiment, a direction in which each contact portion 112A extends is a direction normal to a direction toward the center position (the center position of the semiconductor device) in a condition in which the semiconductor device has been loaded on the semiconductor testing device 110J.

This will now be described by considering the contact portion 112A-1 shown in the figure as an example. When a line segment X is drawn between the center position of the semiconductor device and the center position of the contact portion 112A-1, the direction in which the contact portion 112A-1 extends, that is, the direction in which the extending end 125 of the contact portion 112A-1 faces, is the direction indicated by the arrow Y. The direction indicated by the arrow Y is perpendicular to the line segment X. Thus, each contact portion 112A is arranged so as to line on a circumference of an imaginary circle, the center of which circle is the center position of the semiconductor device.

The contactor 111 and the semiconductor device 120 have inherent rates of thermal expansion, and the rate of thermal expansion of the contactor 111 is different from the rate of thermal expansion of the semiconductor device 120. Therefore, when a test, such as burn-in, in which heating is performed, is conducted, a difference occurs in the amounts of thermal expansion between the contactor 111 and the semiconductor device 120. When the difference occurs in the amounts of thermal expansion between the contactor 111 and the semiconductor device 120, relative displacement occurs between the bumps 121 provided on the semiconductor device 120 and the contact portions 112A provided on the contactor 111, respectively.

However, as a result of the semiconductor testing device 110J having the above-described arrangement, directions of the relative displacement occurring between the bumps 121 and the contact portions 112A are the directions in which respective line segments X extend, that is, radial directions. Therefore, even if the relative displacement occurs between the bumps 121 and contact portions 112A, it is possible to keep the contact pressures developed between the bumps 121 and the contact portions 112A, respectively, constant. This is because, in this case, the directions of the relative displacement occurring between the bumps 121 and the contact portions 112A, respectively, are the directions along the widths of the contact portions 112A. As a result, the contact pressures developed between the bumps 121 and the contact portions 112A, respectively, do not change, even when the relative displacement occurs. Therefore, the above-described arrangement in which the direction in which each contact portion 112A extends, that is, the direction in which the extending end 125 of the contact portion 112A faces, is the direction indicated by the arrow Y, shown in FIG. 52, enables stable electrical connection to be maintained.

Further, it is also possible that the direction in which each contact portion 112A extends, that is, the direction in which the extending end 125 of the contact portion 112A faces, is the direction in which the line segment X, shown in FIG. 52, extends. In this case, it is possible to prevent the bumps 121 from separating from the contact portions 112A, respectively. This is because, in this case, the directions of the relative displacement occurring between the bumps 121 and the contact portions 112A are the directions indicated by the arrows Y1 and Y2, shown in FIG. 27B. Because the directions indicated by the arrows Y1 and Y2, shown in FIG. 27B, are the longitudinal directions of the contact portion 112A, the bump 121 is not likely to separate from the contact portion 112A, even when the relative displacement occurs. Therefore, the above-described arrangement in which the direction in which each contact portion 112A extends, that is, the direction in which the extending end 125 of the contact portion 112A faces, is the direction in which the line segment X, shown in FIG. 52, extends enables stable electrical connection to be maintained.

Thus, the direction in which the contact portion extends may be set based on the directions of relative displacement occurring between the respective one of the spherical connection terminals (bumps) and the contact portion due to a difference in thermal expansion between the contactor and the semiconductor device. Thereby, it is possible to set the direction in which the contact portion extends so that the contact pressure developed between the spherical connection terminal and the contact portion is prevented from changing due to the relative displacement. Specifically, the direction in which the contact portion extends is set to a direction which is perpendicular to the directions of the relative displacement. As a result, the contact pressure developed between the spherical connection terminal and the contact portion can be prevented from changing, and, thus, stable connection can be maintained. Alternatively, it is also possible to set the direction in which the contact portion extends so that the spherical connection terminal is prevented from separating from the contact portion due to the relative displacement. Specifically, the direction in which the contact portion extends is set to a direction corresponding to the directions of the relative displacement. As a result, the spherical connection terminal can be prevented from separating from the contact portion, and, thus, a stable connection can be maintained.

The thirty-third embodiment of the present invention will now be described.

Figure 53A:
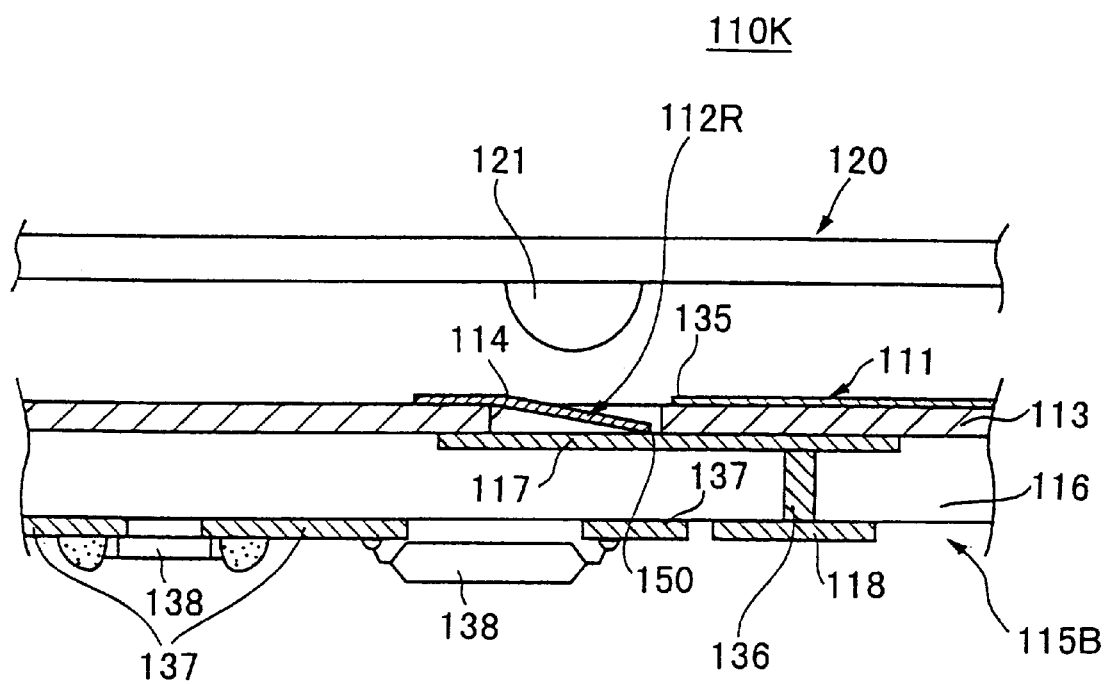
FIGS. 53A and 53B show elevational sectional views for illustrating a semiconductor testing device in a thirty-third embodiment of the present invention.
Figure 53B:
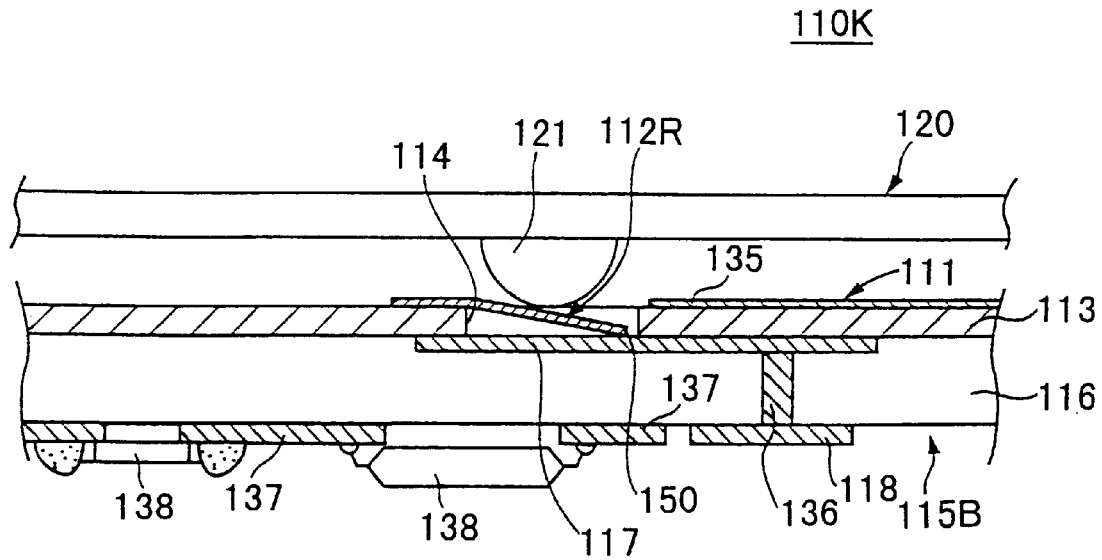

FIGS. 53A and 53B show a semiconductor testing device 110K in the thirty-third embodiment of the present invention. In this embodiment, a single layer of wiring substrate 115B is used, and a contact portion 112R is previously connected with the internal connection terminal 117.

As mentioned above, recently, the semiconductor device 120 operates at high speed. In response thereto, signals used in testing of the semiconductor device 120 flow at high speed. Thus, it is important to protect the testing from entrance of disturbance. For this purpose, there is a case where a partial circuit of a semiconductor tester used in testing of the semiconductor device 120 is provided on the semiconductor testing device 110K. Electronic components 138, shown in FIGS. 53A, 53B, include the partial circuit of the semiconductor tester.

As locations at which the electronic components 138 are provided, the contactor 111 or the wiring substrate 115B may be considered. However, it is very difficult to provide the electronic components 138 on the contactor 111 which is a membrane substrate, and, also, the cost required therefor is high. Further, when the electronic components 138 are provided on the contactor 111, it is necessary to provide electronic wires for the electronic components 138 on the insulating substrate 113 other than the contact portion 112R. Thereby, a problem occurs, that is, it is not possible to achieve a high-density arrangement.

Therefore, in this embodiment, the electronic components 138 are provided on the wiring substrate 115B. Further, in order to achieve high-speed transmission of a test signal and to prevent entrance of disturbance, it is necessary to reduce the wiring length of the interposer between the internal connection terminal 117 and the external connection terminal 118 as much as possible. For this purpose, in this embodiment, the single-layer substrate is used as the wiring substrate 115B so that the wiring length is reduced. Electrical connection between the internal connection terminal 117 and the external connection terminal 118 is provided by using a through-hole conductor 136 formed in an insulating layer 116.

As a result of the contact portion 112R being previously connected with the internal connection terminal 117, the contact portion 112R is not bent each time the bump 121 is inserted into the opening 114. Thereby, brittle fracture of the contact portion 112R, at the position at which the contact portion 112R is in contact with the periphery of the opening 114, can be prevented. As a result, it is possible to elongate the life of the contactor 111.

The spherical connection terminal of the semiconductor device is not limited to the bump made of solder. It is also possible that, in the semiconductor device, for which the present invention can be used, another material (gold, copper, or the like, for example) is used as the material of the spherical connection terminal. Further, it is also possible that, in the semiconductor device, for which the present invention can be used, a connection terminal other than the spherical connection terminal (a stud-shaped bump, for example) can be used, alternatively.

Further, the wiring substrate is not limited to a substrate made of a resin such as glass epoxy. It is also possible to use a substrate made of another material, such as a ceramic substrate or the like.

Further, the present invention is not limited to the above-described embodiments, and variations and modifications may be made without departing from the scope of the present invention.

The contents of the basic Japanese Patent Application Nos.9-255786 and 10-263579, filed on Sep. 19, 1997 and Sep. 17, 1998, respectively, are hereby incorporated by reference.

What is claimed is:

1. A semiconductor testing device, which is used for performing a test on a semiconductor device having spherical connection terminals, comprising:

a contactor, provided with a single layer of insulating substrate, in which substrate an opening is formed at a position corresponding to a respective one of said spherical connection terminals, said contactor also being provided with a contact portion, which includes a connection portion with which said respective one of said spherical connection terminals is electrically connected, said contact portion being provided on said single layer of insulating substrate so that said connection portion is located on said opening; and a wiring substrate, on which said contactor is mounted in a manner which permits installation and removal of said contactor onto and from said wiring substrate, said wiring substrate being provided with a first connection terminal which is provided on a first surface, on which said contactor is mounted, and is electrically connected with said contact portion, a second connection terminal which is provided on a second surface, which is opposite to said first surface, and is connected externally, and an interposer which electrically connects said first connection terminal with said second connection terminal, wherein the contact portion is bendable so that, as the spherical connection terminal is pressed onto the contact portion, the contact portion is bent, and thereby the connection portion of the contact portion comes into contact with the first connection terminal of the wiring substrate.

2. The semiconductor testing device as claimed in claim 1, wherein an extending portion is formed in said insulating substrate, said extending portion extending in said opening so as to face said contact portion, and partially supporting said contact portion.

3. The semiconductor testing device as claimed in claim 1, wherein a pointed-end portion is formed at an extending-end portion of said contact portion.

* * * * *